(12) United States Patent
Chiang et al.

(10) Patent No.: US 12,205,860 B2
(45) Date of Patent: *Jan. 21, 2025

(54) SENSOR PACKAGES

(71) Applicant: Taiwan Semiconductor Manufacturing Company, Ltd., Hsinchu (TW)

(72) Inventors: Tsung-Hsien Chiang, Hsinchu (TW); Yu-Chih Huang, Hsinchu (TW); Ting-Ting Kuo, Hsinchu (TW); Chih-Hsuan Tai, Taipei (TW); Ban-Li Wu, Hsinchu (TW); Ying-Cheng Tseng, Tainan (TW); Chi-Hui Lai, Taichung (TW); Chiahung Liu, Hsinchu (TW); Hao-Yi Tsai, Hsinchu (TW); Chung-Shi Liu, Hsinchu (TW); Chen-Hua Yu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/351,010

(22) Filed: Jul. 12, 2023

(65) Prior Publication Data

US 2023/0352357 A1 Nov. 2, 2023

Related U.S. Application Data

(60) Continuation of application No. 17/092,543, filed on Nov. 9, 2020, now Pat. No. 11,742,254, which is a
(Continued)

(51) Int. Cl.
*H01L 23/31* (2006.01)
*H01L 21/56* (2006.01)
(Continued)

(52) U.S. Cl.
CPC ........ *H01L 23/3171* (2013.01); *H01L 21/565* (2013.01); *H01L 21/76837* (2013.01);
(Continued)

(58) Field of Classification Search
None
See application file for complete search history.

(56) References Cited

U.S. PATENT DOCUMENTS 8,263,434 B2 9/2012 Pagaila et al.
8,361,842 B2 1/2013 Yu et al.
(Continued)

FOREIGN PATENT DOCUMENTS

CN 101246897 A 8/2008
CN 101989558 A 3/2011
(Continued)

*Primary Examiner* — Khaja Ahmad
(74) *Attorney, Agent, or Firm* — Slater Matsil, LLP

(57) ABSTRACT

In an embodiment, a device includes: a sensor die having a first surface and a second surface opposite the first surface, the sensor die having an input/output region and a first sensing region at the first surface; an encapsulant at least laterally encapsulating the sensor die; a conductive via extending through the encapsulant; and a front-side redistribution structure on the first surface of the sensor die, the front-side redistribution structure being connected to the conductive via and the sensor die, the front-side redistribution structure covering the input/output region of the sensor die, the front-side redistribution structure having a first opening exposing the first sensing region of the sensor die.

20 Claims, 24 Drawing Sheets

Related U.S. Application Data division of application No. 16/266,276, filed on Feb. 4, 2019, now Pat. No. 10,832,985.

(60) Provisional application No. 62/737,282, filed on Sep. 27, 2018.

(51) Int. Cl.
  H01L 21/768 (2006.01)
  H01L 23/00 (2006.01)
  H01L 23/522 (2006.01)
  H01L 23/528 (2006.01)

(52) U.S. Cl.
  CPC ........ H01L 23/5226 (2013.01); H01L 23/528 (2013.01); H01L 24/09 (2013.01); *H01L 2224/02373* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,691,708 | B1 | 6/2017 | Huang et al. |
| 2008/0191297 | A1 | 8/2008 | Yang et al. |
| 2008/0203511 | A1* | 8/2008 | Huang ............... H01L 31/0203 257/E31.124 |
| 2009/0102002 | A1* | 4/2009 | Chia ................. H01L 27/14618 257/E31.113 |
| 2011/0045634 | A1 | 2/2011 | Pagaila |
| 2011/0291288 | A1 | 12/2011 | Wu et al. |
| 2013/0026468 | A1 | 1/2013 | Yoshimuta et al. |
| 2013/0026589 | A1 | 1/2013 | Wu et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0247859 | A1* | 9/2014 | Kim ......................... G01K 7/42 374/178 |
| 2014/0252646 | A1 | 9/2014 | Hung et al. |
| 2014/0264930 | A1 | 9/2014 | Yu et al. |
| 2015/0087101 | A1* | 3/2015 | Zung ................. H01L 27/14618 438/65 |
| 2015/0200219 | A1* | 7/2015 | Oganesian ............. H01L 24/19 257/443 |
| 2015/0259194 | A1 | 9/2015 | Lin et al. |
| 2016/0163566 | A1 | 6/2016 | Chen et al. |
| 2016/0212851 | A1 | 7/2016 | Hu et al. |
| 2017/0033063 | A1 | 2/2017 | Lin et al. |
| 2017/0092604 | A1 | 3/2017 | Hsieh et al. |
| 2017/0228529 | A1 | 8/2017 | Huang et al. |
| 2017/0249493 | A1 | 8/2017 | Yu et al. |

FOREIGN PATENT DOCUMENTS

| | | |
|---|---|---|
| CN | 102903722 A | 1/2013 |
| CN | 105845639 A | 8/2016 |
| CN | 107644847 A | 1/2018 |
| KR | 20170094483 A | 8/2017 |
| KR | 20170101092 A | 9/2017 |
| KR | 20180004062 A | 1/2018 |

* cited by examiner

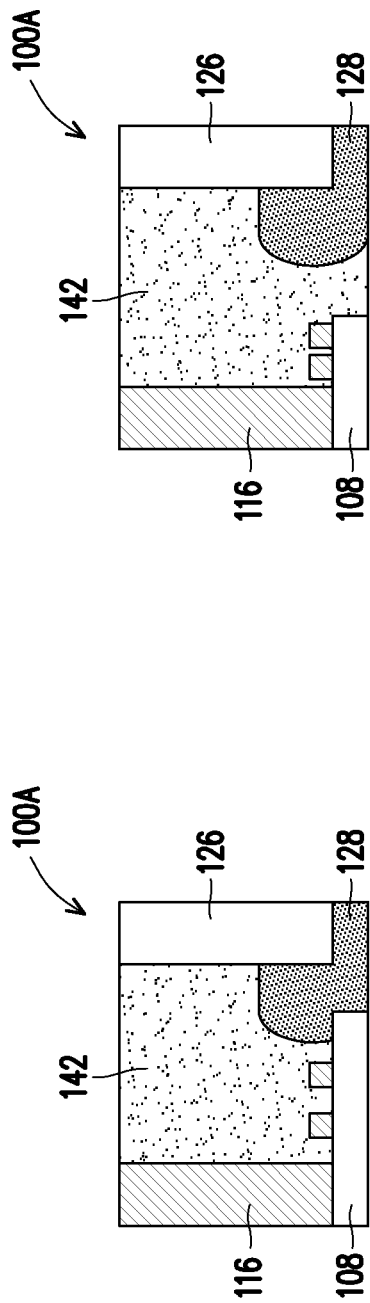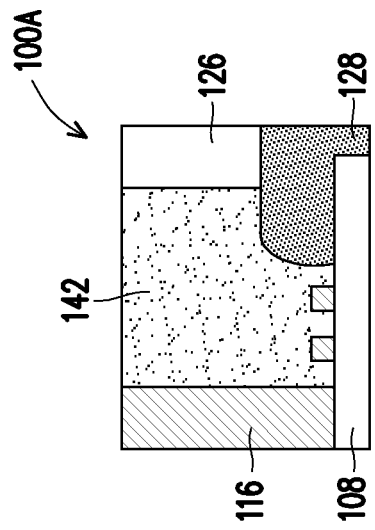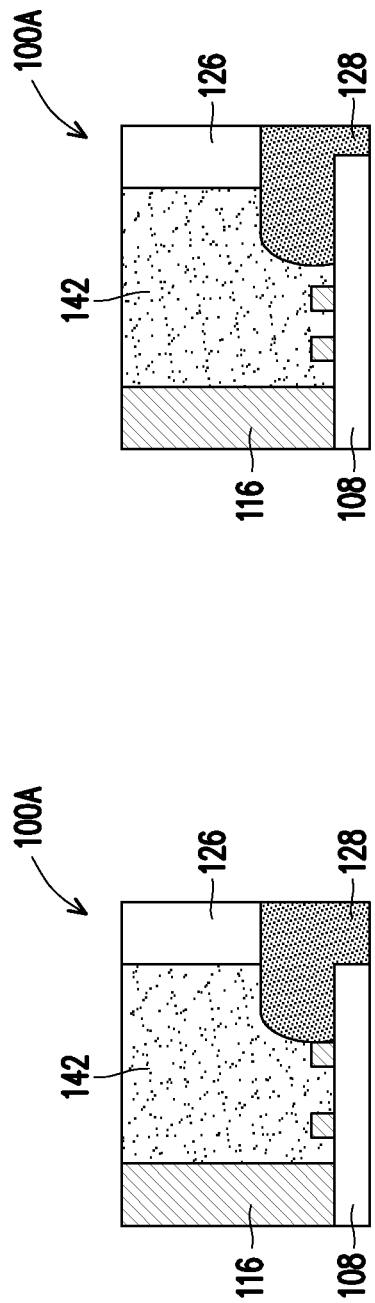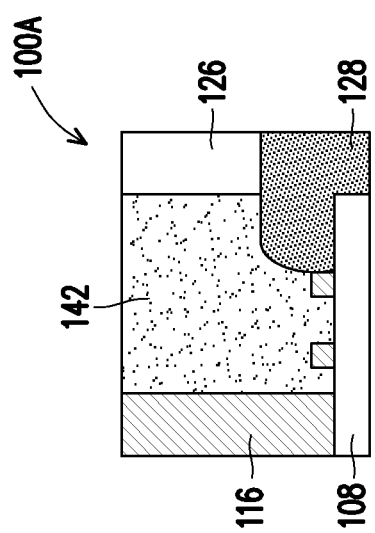

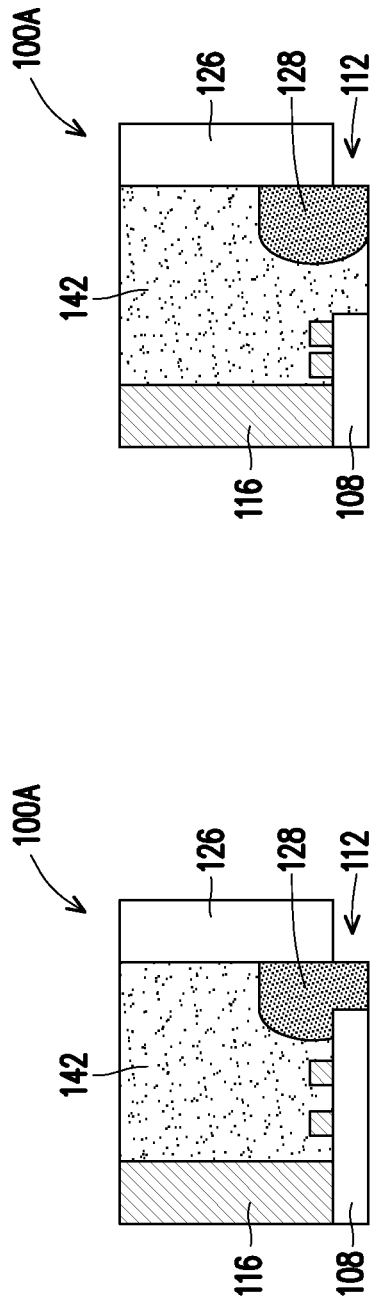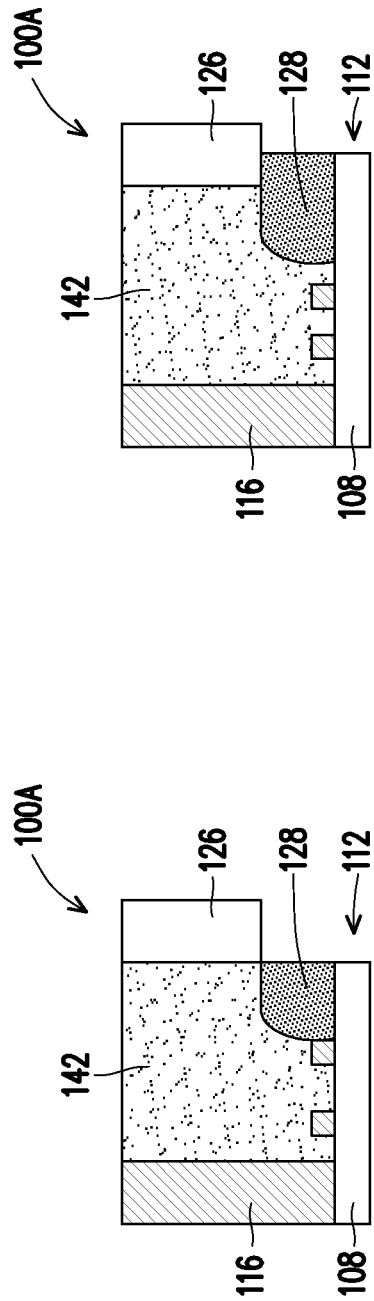

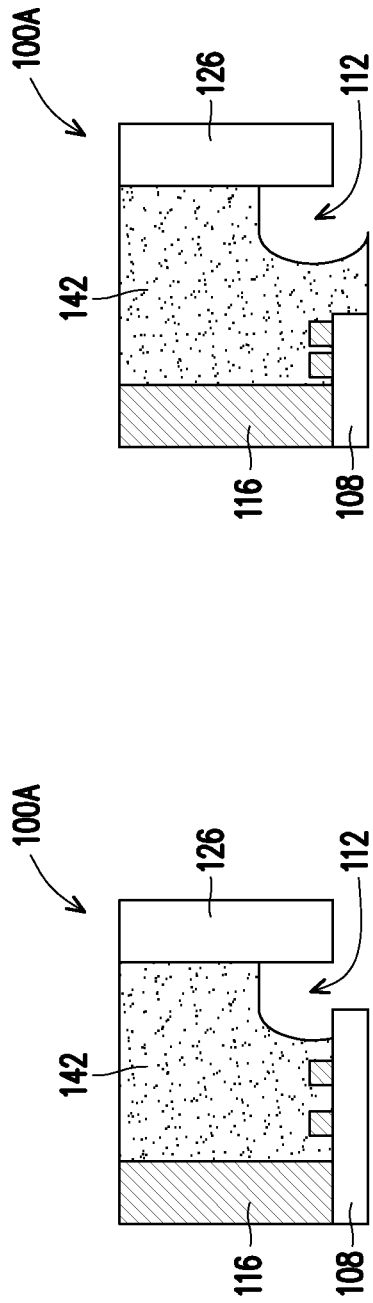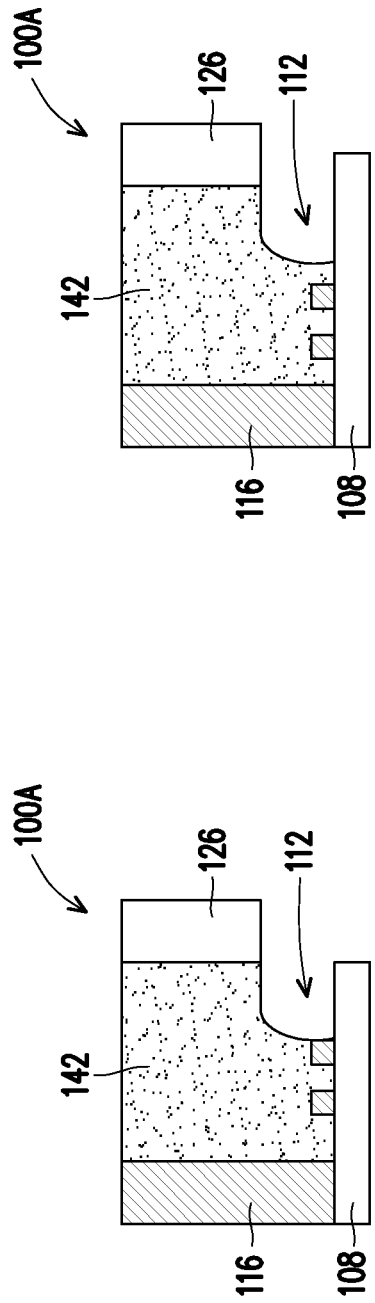

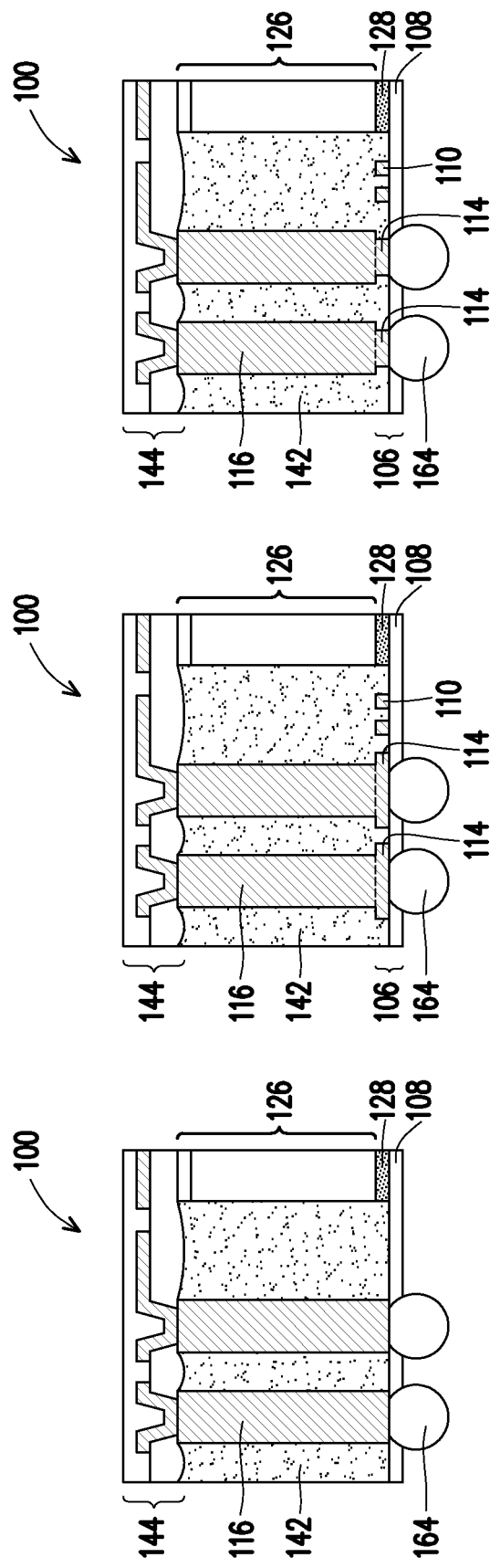

SENSOR PACKAGES

PRIORITY CLAIM AND CROSS-REFERENCE

This application is a continuation of U.S. patent application Ser. No. 17/092,543, filed on Nov. 9, 2020, which is a divisional of U.S. patent application Ser. No. 16/266,276, filed on Feb. 4, 2019, now U.S. Pat. No. 10,832,985, issued on Nov. 10, 2020, which application claims the benefit of U.S. Provisional Application No. 62/737,282, filed on Sep. 27, 2018, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most pail, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is integrated fan-out (InFO) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5A, 5B, 5C, 5D, 6, 7, 8, 9, 10, and 11 illustrate cross-sectional views of intermediate steps during a process for forming a sensor package, in accordance with some embodiments.

FIGS. 12, 13A, 13B, 13C, 13D, 14A, 14B, 14C, and 14D illustrate a sensing device implementing a sensor package, in accordance with some embodiments.

FIGS. 24A, 24B, and 24C illustrate package components, in accordance with some embodiments.

DETAILED DESCRIPTION

Figure 1:
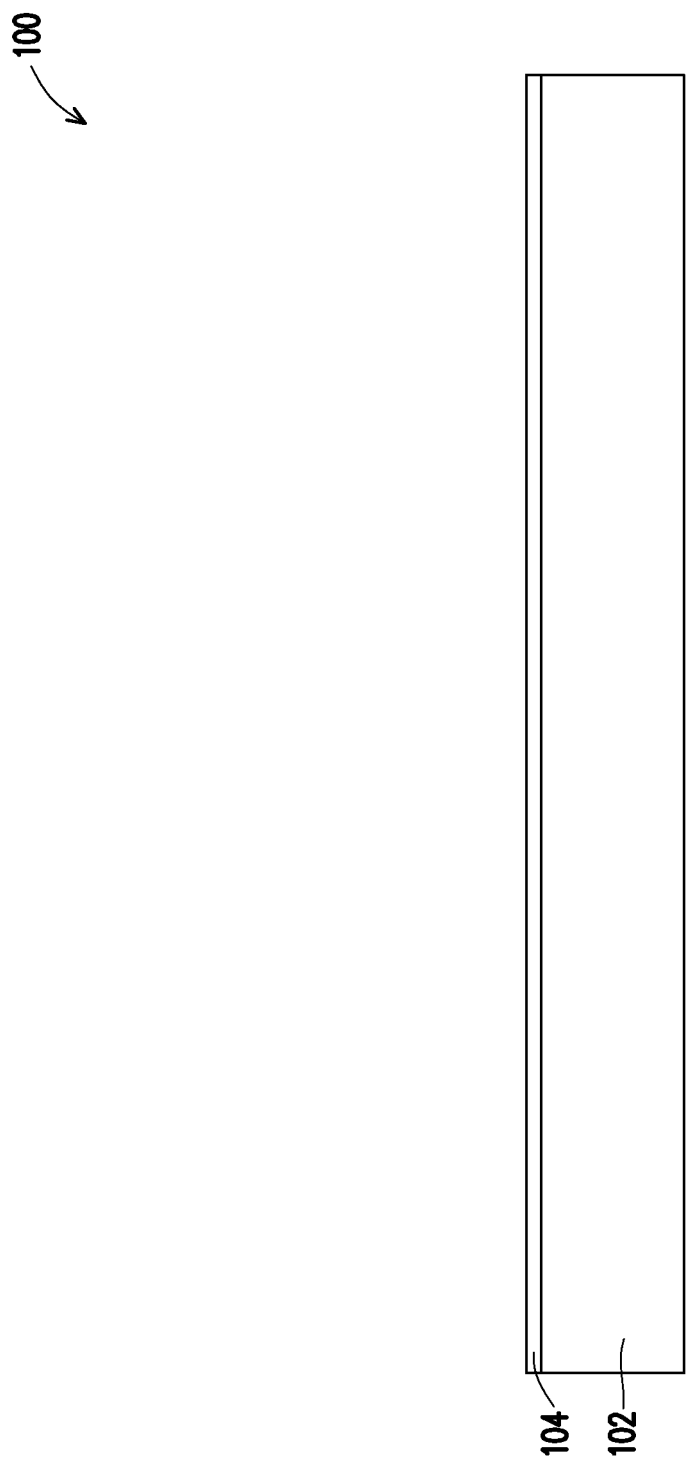

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a sensor die is packaged in an InFO package. The sensor die may include sensing regions at the active and/or back surfaces of the sensor die. The InFO package may include openings that expose the sensing regions of the sensor die, while other regions (e.g., input/output (I/O) regions) of the sensor die may remain protected. Packaging a sensor die in an InFO package may allow the form factor of the final sensor package to be smaller, may increase the mechanical reliability of the packaged sensor, and may increase the manufacturing yield as compared to other (e.g., wire bond) packaging schemes.

FIGS. 1 through 11 illustrate cross-sectional views of intermediate steps during a process for forming a package component 100, in accordance with some embodiments. A single package region is illustrated, and a sensor package 101 (see FIG. 12) is formed in the illustrated package region. The sensor package 101 may be an integrated fan-out (InFO) package. It should be appreciated that the package component 100 includes many package regions. FIG. 12 illustrates a sensing device 200 implementing the sensor package 101, in accordance with some embodiments. The sensing device 200 may be any device that implements the sensor package 101, such as a smartphone, a tablet, or the like.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of coplanarity.

Figure 2:
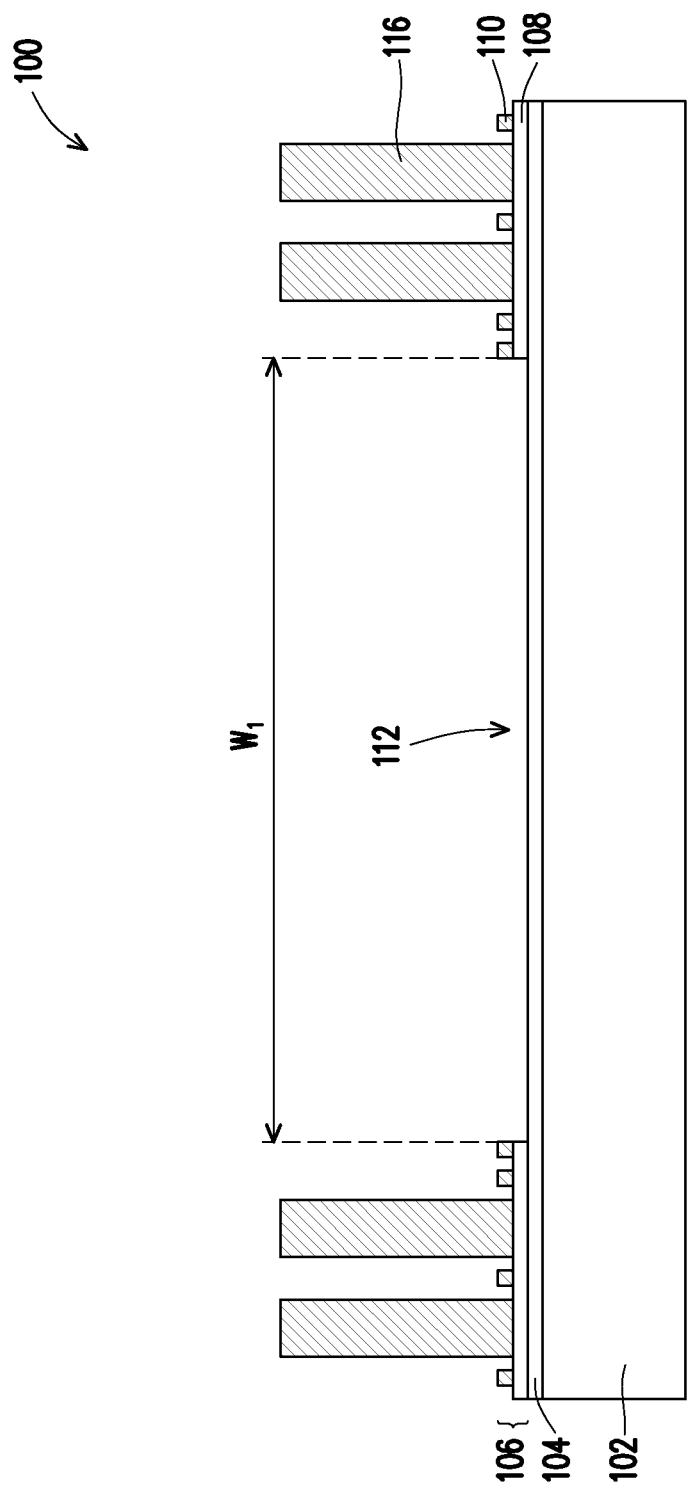

In FIG. 2, a back-side redistribution structure 106 is formed on the release layer 104. In the embodiment shown, the back-side redistribution structure 106 includes a dielectric layer 108 and a metallization pattern no (sometimes referred to as redistribution layers or redistribution lines). The back-side redistribution structure 106 is optional. In some embodiments, the metallization pattern no is omitted and only the dielectric layer 108 is formed.

The dielectric layer 108 is formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof. The dielectric layer 108 is then patterned to form an opening 112 exposing portions of the release layer 104. The patterning may be by an acceptable process, such as by exposing the dielectric layer 108 to light when the dielectric layer 108 is a photo-sensitive material or by etching using, for example, an anisotropic etch. The opening 112 has a first width $W_1$. In some embodiments, the first width $W_1$ is in the range of from about 20030 µm to about 32030 µm, which may be large enough to accommodate an integrated circuit die.

The metallization pattern no is formed on the dielectric layer 108. As an example to form metallization pattern no, a seed layer is formed over the dielectric layer 108 and in the opening 112. In some embodiments, the seed layer is a metal layer, which may be a single layer or a composite layer including a plurality of sub-layers formed of different materials. In some embodiments, the seed layer is a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may be a metal, like copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

It should be appreciated that the back-side redistribution structure 106 may include any number of dielectric layers and metallization patterns. Additional dielectric layers and metallization patterns may be formed by repeating the processes for forming the dielectric layer 108 and metallization pattern 110. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically connect the various conductive lines. In embodiments where the back-side redistribution structure 106 includes multiple layers, the opening 112 may extend through each respective dielectric layer.

In some embodiments the back-side redistribution structure 106 includes a topmost dielectric or passivation layer, covering and protecting the metallization pattern 110. In the embodiment shown, the topmost layer is omitted, and a subsequently formed encapsulant is used to protect the metallization pattern no.

Further, conductive vias 116 are formed on and extending away from the dielectric layer 108. As an example to form the conductive vias 116, a seed layer is formed over the back-side redistribution structure 106, e.g., on the dielectric layer 108 and metallization pattern 110. The seed layer for the conductive vias 116 may be different than the seed layer for the metallization pattern 110, and may be further formed over the metallization pattern 110. In some embodiments, the seed layer is a metal layer, which may be a single layer or a composite layer including a plurality of sub-layers formed of different materials. In a particular embodiment, the seed layer is a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may be a metal, like copper, titanium, tungsten, aluminum, the like, or combinations thereof. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 116. In the embodiment shown, the conductive vias 116 are formed directly on the dielectric layer 108 and are connected to the metallization pattern no by conductive lines. In other embodiments (described below), the conductive vias 116 are plated from features of the metallization pattern 110.

Figure 3:
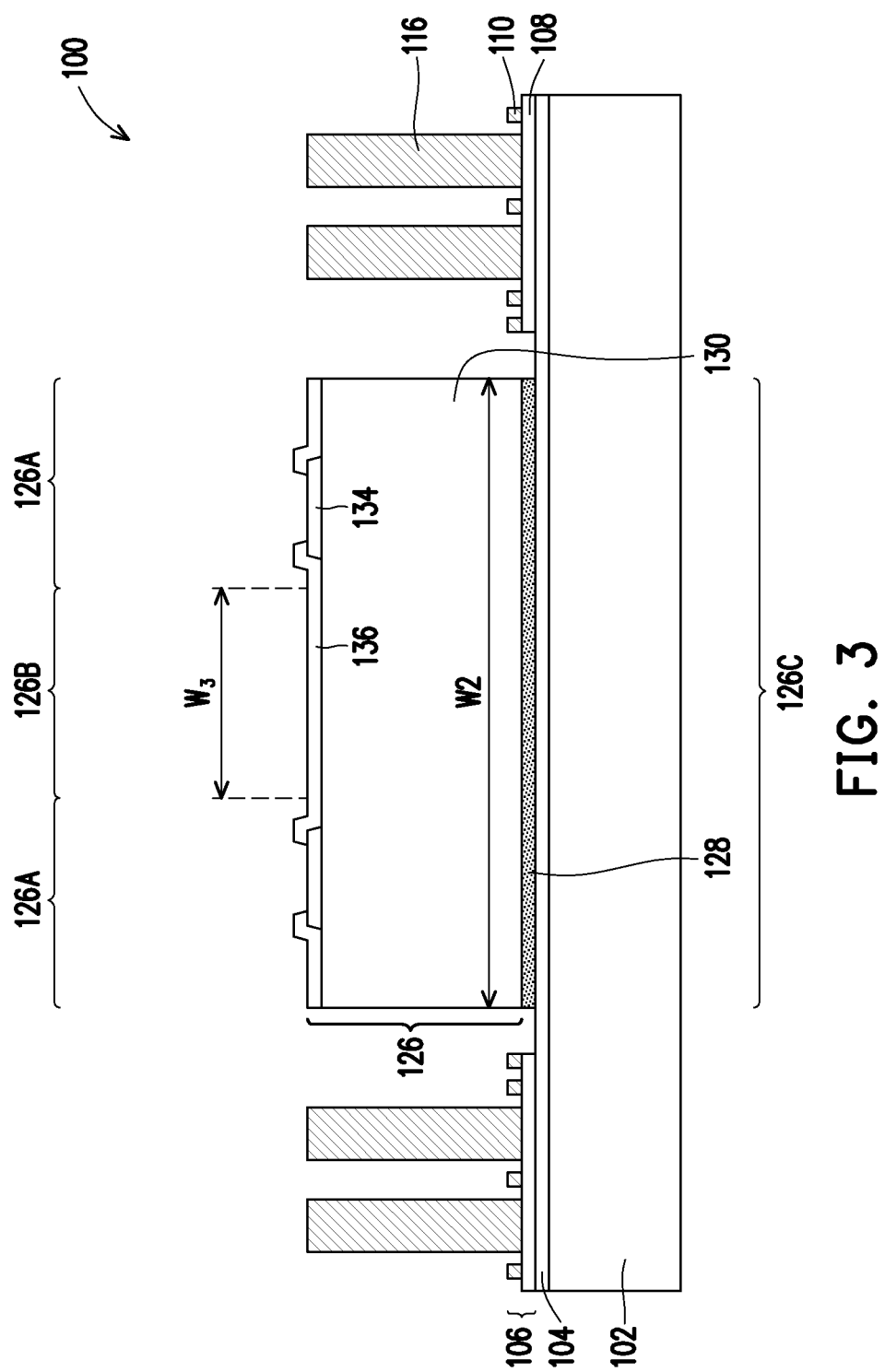

In FIG. 3, an integrated circuit die 126 is adhered to the release layer 104 by an adhesive 128. The integrated circuit die 126 may be disposed in the opening 112 of the back-side redistribution structure 106. The integrated circuit die 126 may be any type of die, such as a sensor die, logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, micro-electro-mechanical-system (MEMS) die, signal processing die (e.g., digital signal processing (DSP) die), front-end die (e.g., analog front-end (AFE) die), the like, or a combination thereof. The integrated circuit die 126 has a second width $W_2$. When the integrated circuit die 126 is disposed in the opening 112, the second width $W_2$ is less than or equal to the first width $W_1$ (see FIG. 2). In some embodiments, the second width $W_2$ is in the range of from about 20000 µM to about 32000 µm. In other embodiments, the integrated circuit die 126 may be disposed over the opening 112, and in such embodiments, the second width $W_2$ is greater than the first width $W_1$.

Before being adhered to the release layer 104, the integrated circuit die 126 may be processed according to applicable manufacturing processes to form integrated circuits in the integrated circuit die 126. For example, the integrated circuit die 126 includes a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the active surface of the semiconductor substrate 130 and may be interconnected by interconnect structures formed by, for example, metallization patterns in one or more dielectric layers on the semiconductor substrate 130 to form an integrated circuit.

The integrated circuit die 126 further includes pads 134, such as aluminum pads, copper pads, or the like, to which external connections are made. The pads 134 are on the active surface of the integrated circuit die 126. One or more passivation films 136 are on the integrated circuit die 126 and on portions of the pads 134. Openings extend through the passivation films 136 to expose the pads 134.

In some embodiments, the integrated circuit die 126 is a sensor die. The sensor die may be an image sensor, an acoustic sensor, or the like. The sensor die may include one or more transducers and may also include one or more features that emit signals for measurement during operation. For example, the sensor die may be a fingerprint sensor that operates by emitting ultrasonic acoustic waves and measuring reflected waves. The integrated circuit die 126 has an I/O region 126A and a sensing region 126B at the active surface. The I/O region 126A may (or may not) surround the sensing region 126B. The sensing region 126B has a third width $W_3$, which is less than the second width $W_2$. In some embodiments, the third width $W_3$ is in the range of from about 16000 μm to about 30000 μm. In some embodiments, the sensor die is packaged in an InFO package, and is packaged in a manner that allows the sensing region 126B to be exposed. In some embodiments, the integrated circuit die 126 further includes a sensing region 126C at the back surface of the integrated circuit die 126. In such embodiments, the sensing die is packaged in a manner that allows the sensing region 126C to also be exposed.

The adhesive 128 is on the back surface of the integrated circuit die 126 and adheres the integrated circuit die 126 to the release layer 104. The adhesive 128 may be any suitable adhesive, epoxy, die attach film (DAF), or the like. The adhesive 128 may be applied to a back-side of the integrated circuit die 126 or may be applied over the surface of the carrier substrate 102. For example, the adhesive 128 may be applied to the back-side of the integrated circuit die 126 before singulating to separate the integrated circuit die 126. Likewise, the adhesive 128 may be applied in the opening 112 of the back-side redistribution structure 106, before attaching the integrated circuit die 126.

Although one integrated circuit die 126 is illustrated as being adhered in the illustrated package region, it should be appreciated that more integrated circuit dies 126 may be adhered in each package region. For example, multiple integrated circuit dies 126 may be adhered in each package region. In such embodiments, the integrated circuit dies 126 may vary in size and type. In some embodiments, the integrated circuit die 126 may be dies with a large footprint, such as system-on-chip (SoC) devices. In embodiments where the integrated circuit die 126 have a large footprint, the space available for the conductive vias 116 in the package regions may be limited. Use of the back-side redistribution structure 106 allows for an improved interconnect arrangement when the package regions have limited space available for the conductive vias 116. In embodiments where a sensor die is used, logic dies, memory dies, or a combination thereof may also be included with the sensor die.

Figure 4:
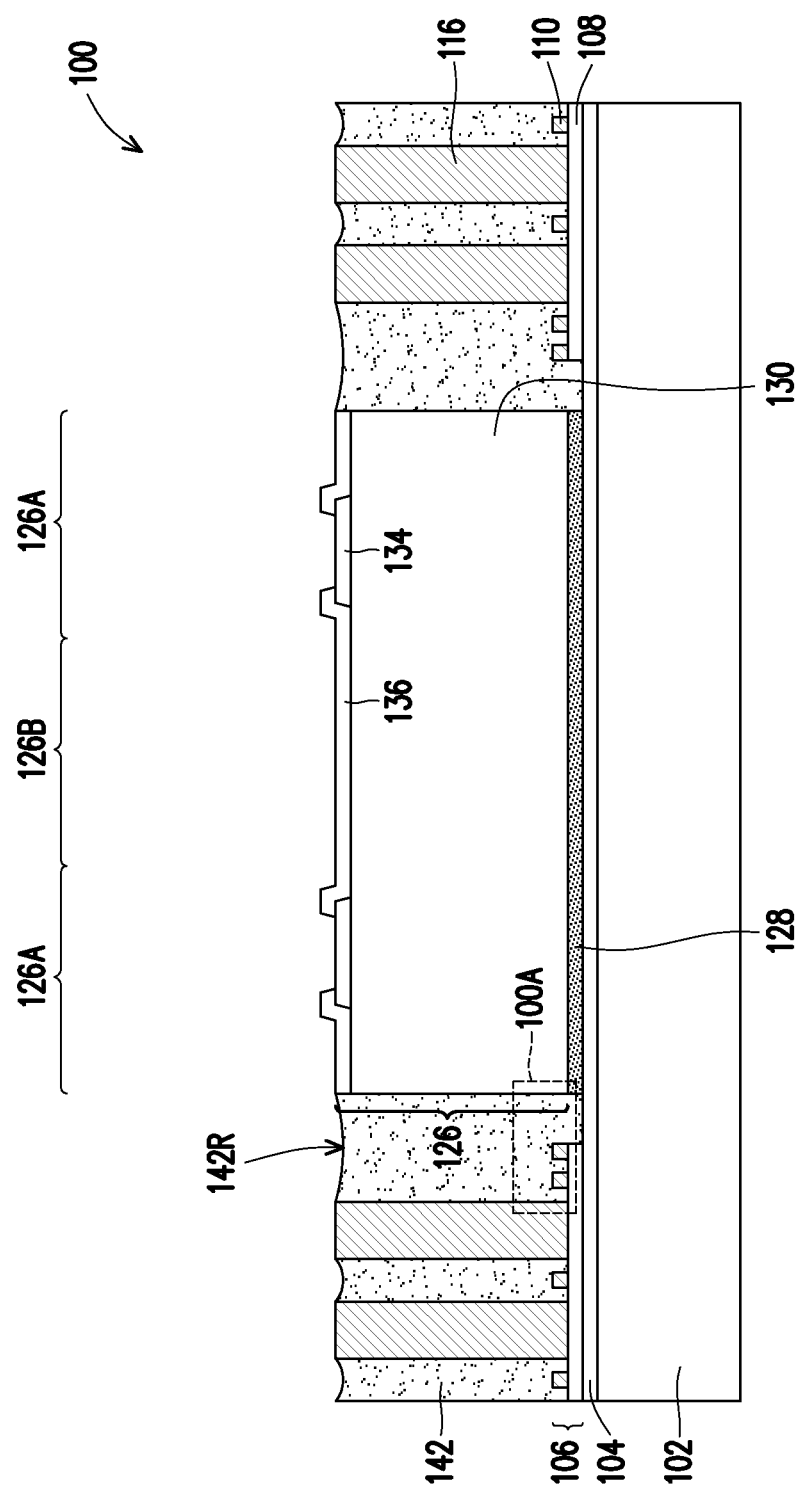

In FIG. 4, an encapsulant 142 is formed on the various components. After formation, the encapsulant 142 at least laterally encapsulates the conductive vias 116 and integrated circuit die 126. The metallization pattern no is thus disposed between the encapsulant 142 and the dielectric layer 108. The encapsulant 142 may be a molding compound, epoxy, or the like. The encapsulant 142 may be applied by compression molding, transfer molding, or the like. The encapsulant 142 is then cured. In the embodiment shown, the encapsulant 142 is formed by transfer molding, such that the conductive vias 116 and integrated circuit die 126 are exposed after molding, and planarization step(s) (e.g., a CMP) may be omitted. Because transfer molding is used to form the encapsulant 142, recesses 142R may be formed in the encapsulant 142, between respective ones of the conductive vias 116 and the integrated circuit die 126. Further, a topmost surface of the passivation films 136 may be above a topmost surface of the encapsulant 142.

When the integrated circuit die 126 is adhered to the release layer 104, it is pressed onto the release layer 104 to improve adhesion of the adhesive 128. The adhesive 128 is a malleable material. As such, during adhesion, some of the adhesive 128 may extrude around the edges of the integrated circuit die 126, and the encapsulant 142 may be formed around the extruded adhesive 128. FIGS. 5A through 5D are detailed views of a region 100A in FIG. 4, showing aspects of the adhesive 128, in accordance with various embodiments.

FIGS. 5A and 5B show embodiments where the first width $W_1$ of the opening 112 (see FIG. 2) is greater than the second width $W_2$ of the integrated circuit die 126 (see FIG. 3). In FIG. 5A, the adhesive 128 contacts the encapsulant 142 and a sidewall of the dielectric layer 108. The adhesive 128 has a curved portion extending from the sidewall of the integrated circuit die 126 to the dielectric layer 108. The curved portion of the adhesive 128 contacts the encapsulant 142. The nearest edge of the dielectric layer 108 is physically separated from the sidewall of the integrated circuit die 126 by only the adhesive 128. In FIG. 5B, the adhesive 128 contacts the encapsulant 142 and is physically separated from the dielectric layer 108. The adhesive 128 has a curved portion extending from the sidewall of the integrated circuit die 126 to beneath the integrated circuit die 126. The curved portion of the adhesive 128 contacts the encapsulant 142. The nearest edge of the dielectric layer 108 is physically separated from the sidewall of the integrated circuit die 126 by both the adhesive 128 and encapsulant 142.

FIG. 5C shows an embodiment where the first width $W_1$ of the opening 112 (see FIG. 2) is equal to the second width $W_2$ of the integrated circuit die 126 (see FIG. 3). In FIG. 5C, the adhesive 128 contacts the encapsulant 142, a sidewall of the dielectric layer 108, and a top surface of the dielectric layer 108. The adhesive 128 has a curved portion extending from the sidewall of the integrated circuit die 126 to the dielectric layer 108. The curved portion of the adhesive 128 contacts the encapsulant 142. The nearest edge of the dielectric layer 108 is physically separated from the sidewall of the integrated circuit die 126 by only the adhesive 128.

FIG. 5D shows an embodiment where the first width $W_1$ of the opening 112 (see FIG. 2) is less than the second width $W_2$ of the integrated circuit die 126 (see FIG. 3). In FIG. 5D, the adhesive 128 contacts the encapsulant 142, a sidewall of the dielectric layer 108, and a top surface of the dielectric layer 108. The adhesive 128 has a curved portion extending from the sidewall of the integrated circuit die 126 to the dielectric layer 1o8. The curved portion of the adhesive 128 contacts the encapsulant 142. The nearest edge of the dielectric layer 108 is physically separated from the sidewall of the integrated circuit die 126 by only the adhesive 128.

Figure 6:
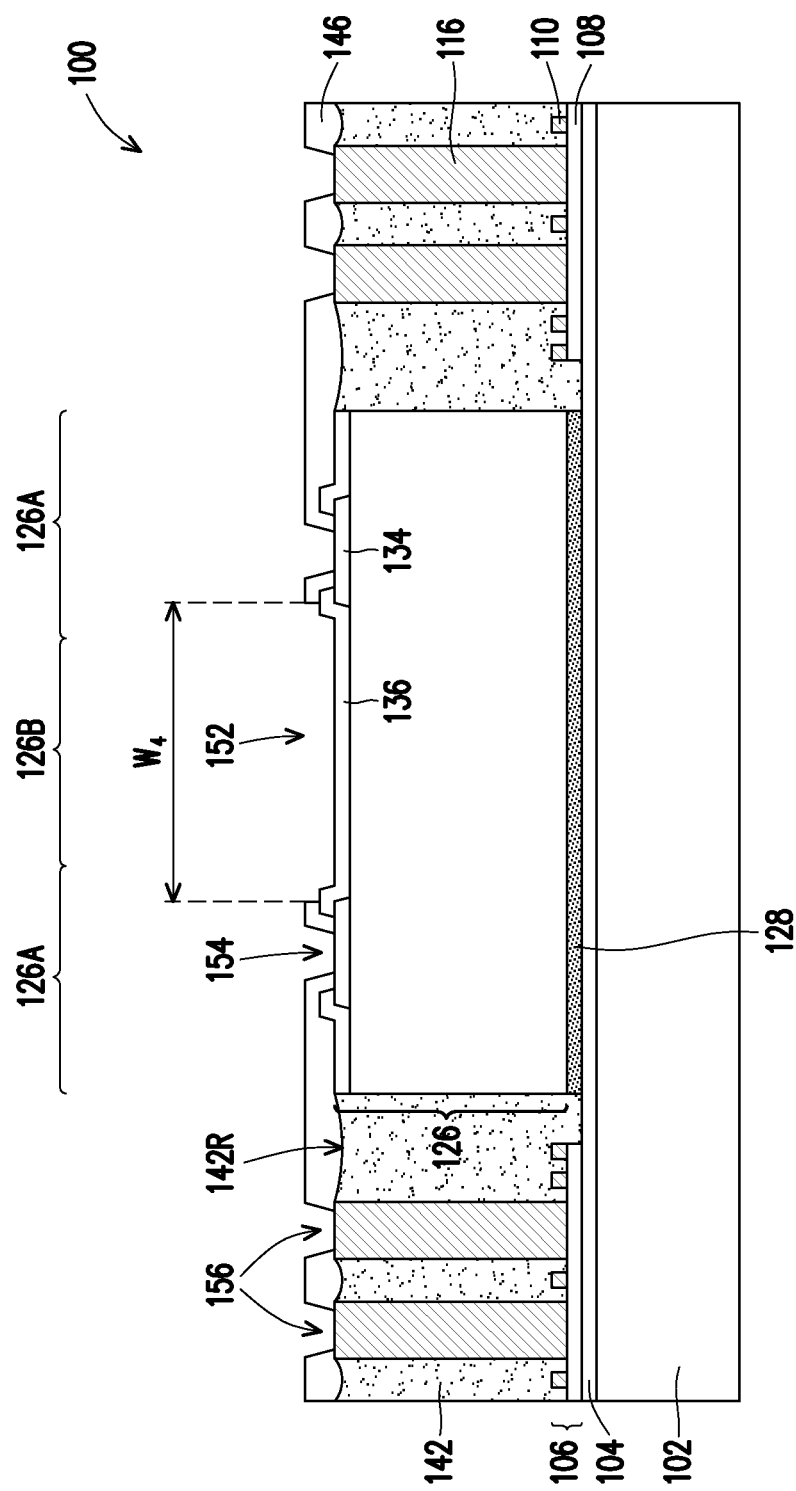
Figure 7:
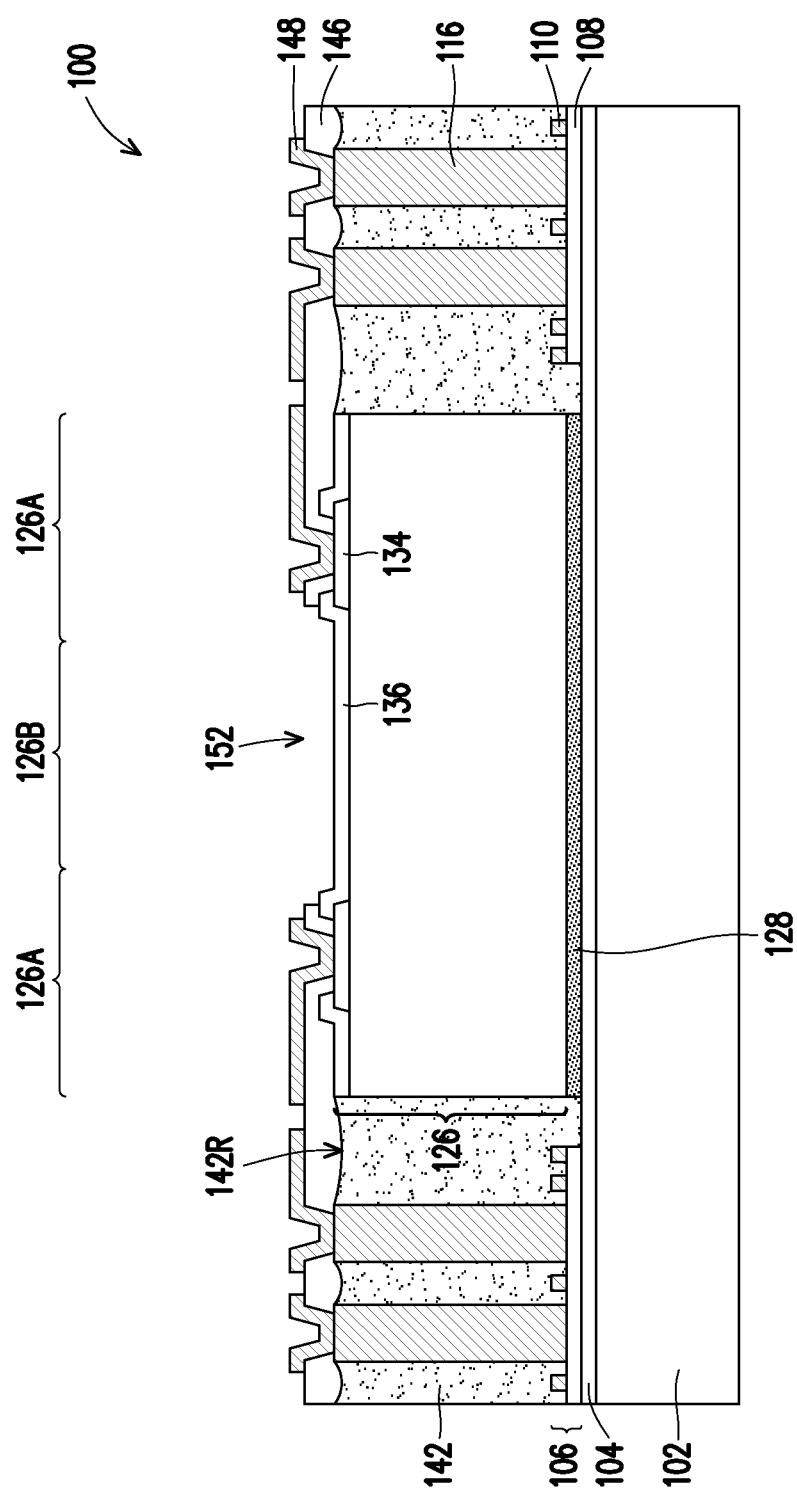
Figure 8:
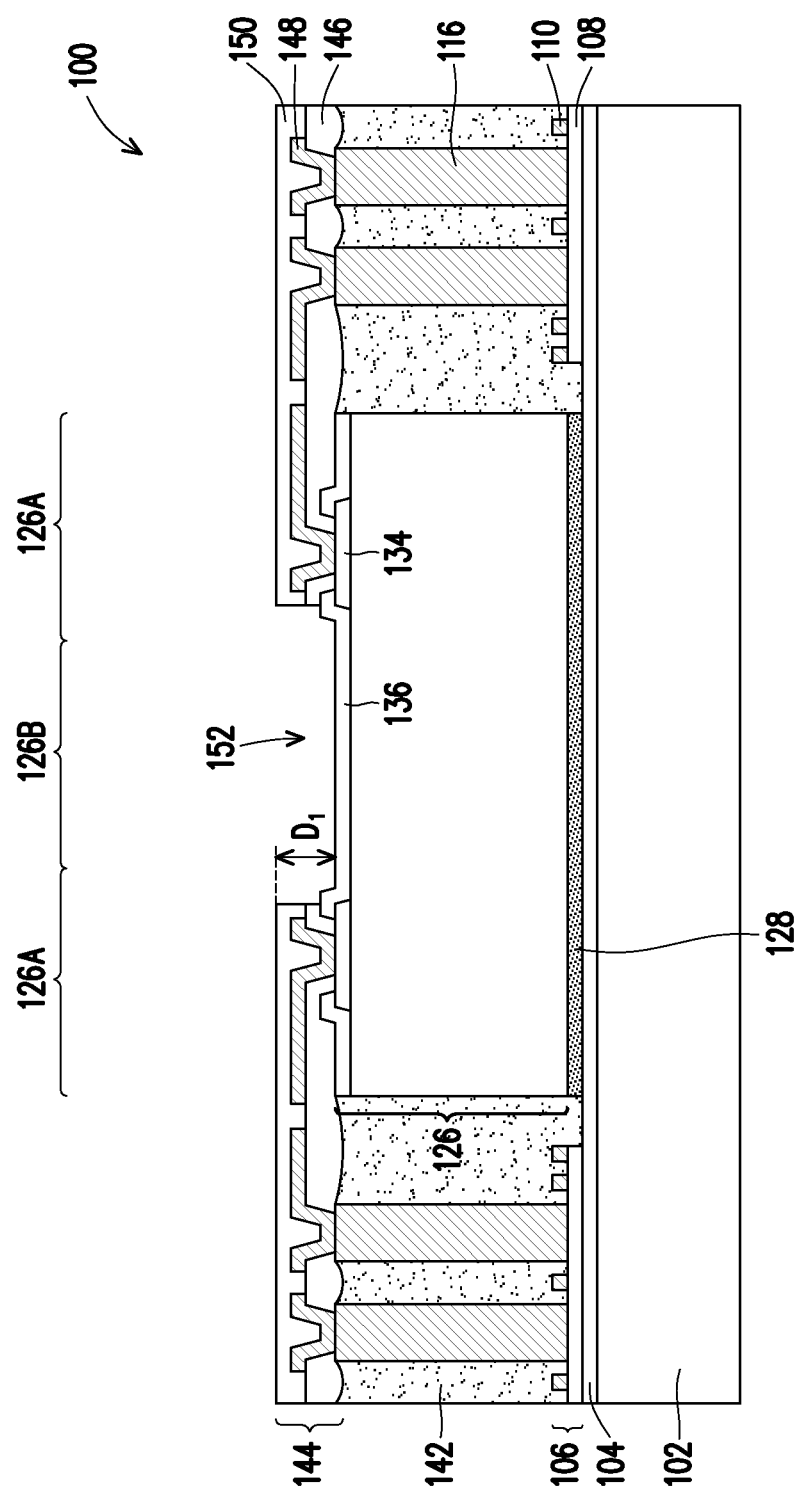

FIGS. 6 through 8 illustrate formation of a front-side redistribution structure 144 (see FIG. 8) over the conductive vias 116, encapsulant 142, and integrated circuit die 126. The front-side redistribution structure 144 includes a dielectric layer 146, a metallization pattern 148, and a dielectric layer 150. The metallization patterns may also be referred to as redistribution layers or redistribution lines. The front-side redistribution structure 144 is shown as an example, and one example process to form the front-side redistribution structure 144 is discussed herein. More or fewer dielectric layers and metallization patterns may be formed in the front-side redistribution structure 144. If more dielectric layers and metallization patterns are to be formed, steps and processes discussed below may be repeated.

The front-side redistribution structure 144 (see FIG. 8) includes an opening 152 exposing the sensing region 126B of the integrated circuit die 126. The opening 152 extends through the dielectric layers 146 and 150 of the front-side redistribution structure 144. The metallization pattern 148 is not formed in the opening 152, such that the opening 152 is free from the materials of the front-side redistribution structure 144 (e.g., materials of the metallization pattern 148 and the dielectric layers 146 and 150). In other words, an air gap is over the sensing region 126B, the air gap being laterally disposed between portions of the front-side redistribution structure 144, the air gap being free from liquid and solid materials. The opening 152 exposes the sensing region 126B of the integrated circuit die 126, allowing it to be used even when the integrated circuit die 126 is packaged and encapsulated. After forming the opening 152, the I/O region 126A of the integrated circuit die 126 remains covered by the front-side redistribution structure 144. The opening 152 has a fourth width $W_4$, which may be greater than or equal to the third width $W_3$. In some embodiments, the fourth width $W_4$ is in the range of from about 16006 μm to about 29734 μm.

In FIG. 6, the dielectric layer 146 is deposited on the encapsulant 142, conductive vias 116, passivation films 136, and pads 134. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. When the encapsulant 142 has recesses 142R, portions of the dielectric layer 146 fill the recesses 142R. The dielectric layer 146 is then patterned. The patterning forms openings 152, 154, and 156 which, respectively, expose the sensing region 126B, pads 134, and conductive vias 116. The width of the opening 152 is greater than the widths of the openings 154 and 156. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

In FIG. 7, the metallization pattern 148 is formed. The metallization pattern 148 includes conductive lines on and extending along the major surface of the dielectric layer 146. The metallization pattern 148 further includes conductive vias extending through the dielectric layer 146 to be physically and electrically connected to the conductive vias 116 and the integrated circuit die 126 (e.g., by the pads 134). When the encapsulant 142 has recesses 142R, top surfaces of the encapsulant 142, conductive vias 116, and integrated circuit die 126 may not be level (e.g., in embodiments where a planarization step is omitted). In such embodiments, the vias of the metallization pattern 148 that are connected to the integrated circuit die 126 have different lengths than the vias of the metallization pattern 148 that are connected to the conductive vias 116.

To form the metallization pattern 148, a seed layer is formed over the dielectric layer 146 and in the openings 152, 154, and 156 extending through the dielectric layer 146. In some embodiments, the seed layer is a metal layer, which may be a single layer or a composite layer including a plurality of sub-layers formed of different materials. In some embodiments, the seed layer is a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 148. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may be a metal, like copper, titanium, tungsten, aluminum, the like, or combinations thereof. The combination of the conductive material and underlying portions of the seed layer form the metallization pattern 148. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

In FIG. 8, the dielectric layer 150 is deposited on the metallization pattern 148 and dielectric layer 146. The dielectric layer 150 may be formed in a manner similar to the dielectric layer 146, and may be formed of the same material as the dielectric layer 146. The opening 152 is then extended through the dielectric layer 150 by patterning the dielectric layer 150 in a similar manner as the patterning of the dielectric layer 146. After the opening 152 is extended, it has a first depth $D_1$ extending from a major surface of the passivation films 136 to a topmost surface of the dielectric layer 150. In some embodiments, the first depth $D_1$ is in the range of from about 17 μm to about 25 μm (such as less than about 25 μm).

In the embodiment shown, the opening 152 is formed during formation of the front-side redistribution structure 144. The opening 152 may also be formed after formation of the front-side redistribution structure 144. For example, the opening 152 may be formed through the dielectric layers 146 and 150 by an anisotropic etch after the dielectric layers 146 and 150 are both formed.

Figure 9:
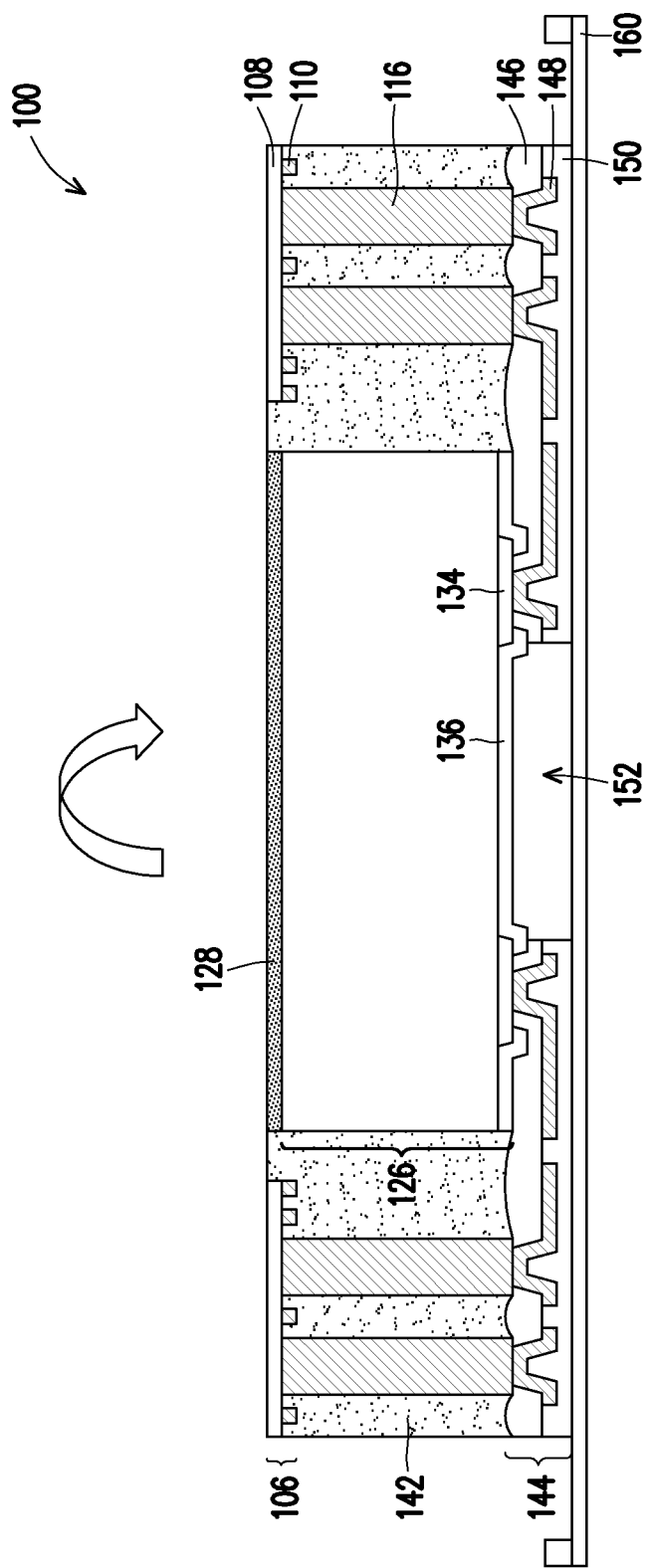

In FIG. 9, a carrier substrate de-bonding is performed to detach (or "de-bond") the carrier substrate 102 from the adhesive 128 and the back-side redistribution structure 106 (e.g., the dielectric layer 108). In some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape 160.

Figure 10:
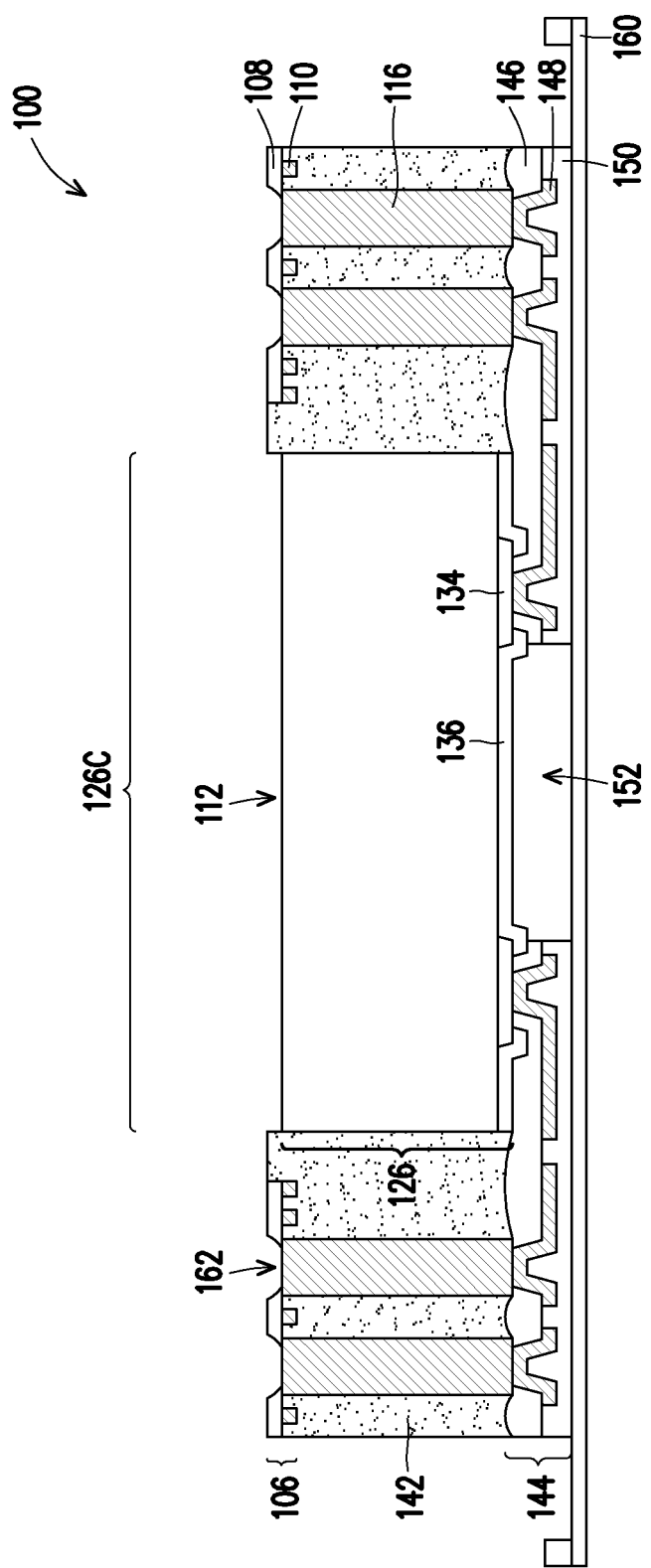

In FIG. 10, openings 162 are formed through the dielectric layer 108 to expose portions of the metallization pattern no and/or conductive vias 116. The openings may be formed, for example, using laser drilling, etching, or the like. Further, during the opening process, the openings 112 in the back-side redistribution structure 106 are re-formed by removing at least a portion of the adhesive 128. The adhesive 128 may be removed for example, using laser drilling, etching, or the like. In some embodiments, the openings 162 are formed and the opening 112 is re-formed in a same process, such as a same laser drilling process. A cleaning process may be performed after the laser drilling process, to remove remaining residue of the adhesive 128 and dielectric layer 108. In embodiments where the integrated circuit die 126 includes a sensing region 126C at the back surface, the opening 112 exposes the sensing region 126C. Other features such as heatsinks or acoustic backing layers may be attached to the integrated circuit die 126 through the opening 112. The InFO package allows such features to be more easily integrated with the sensor die than a wire bond package.

Figure 11:
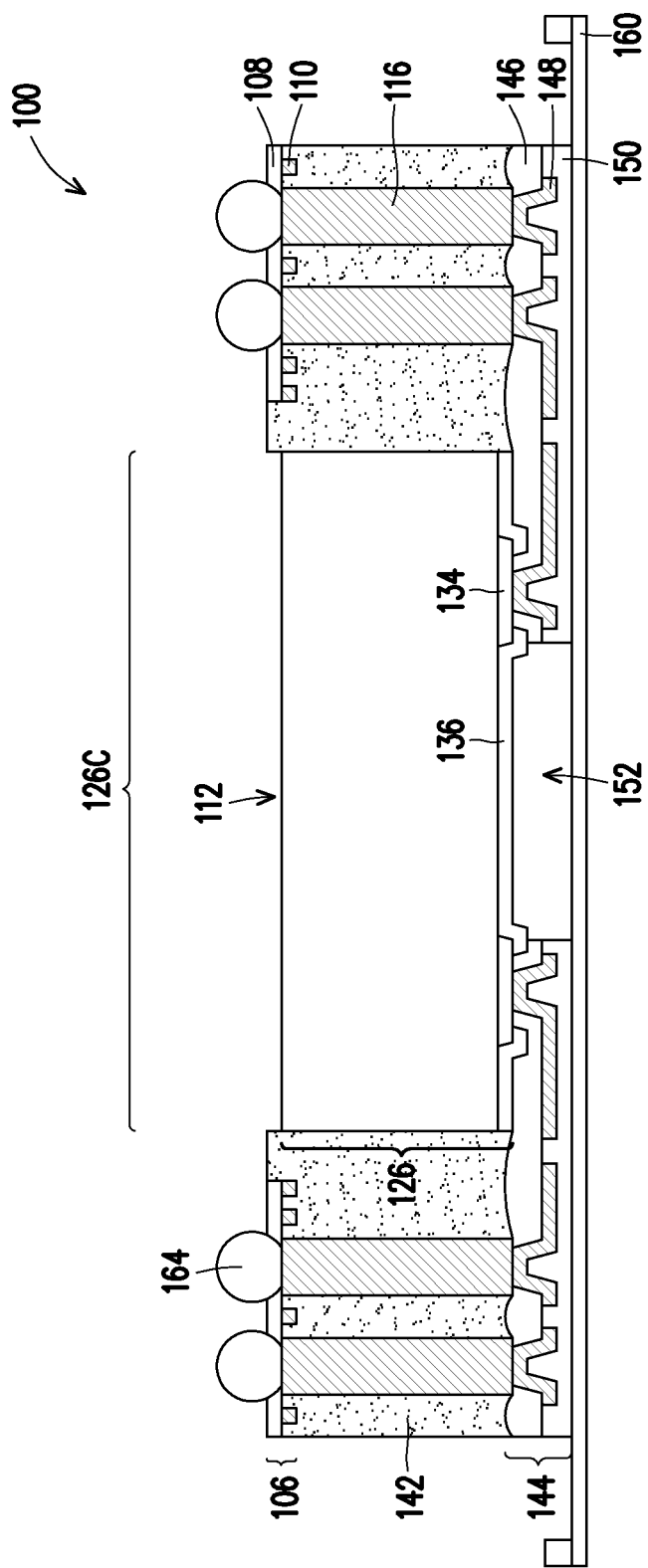
Figure 12:
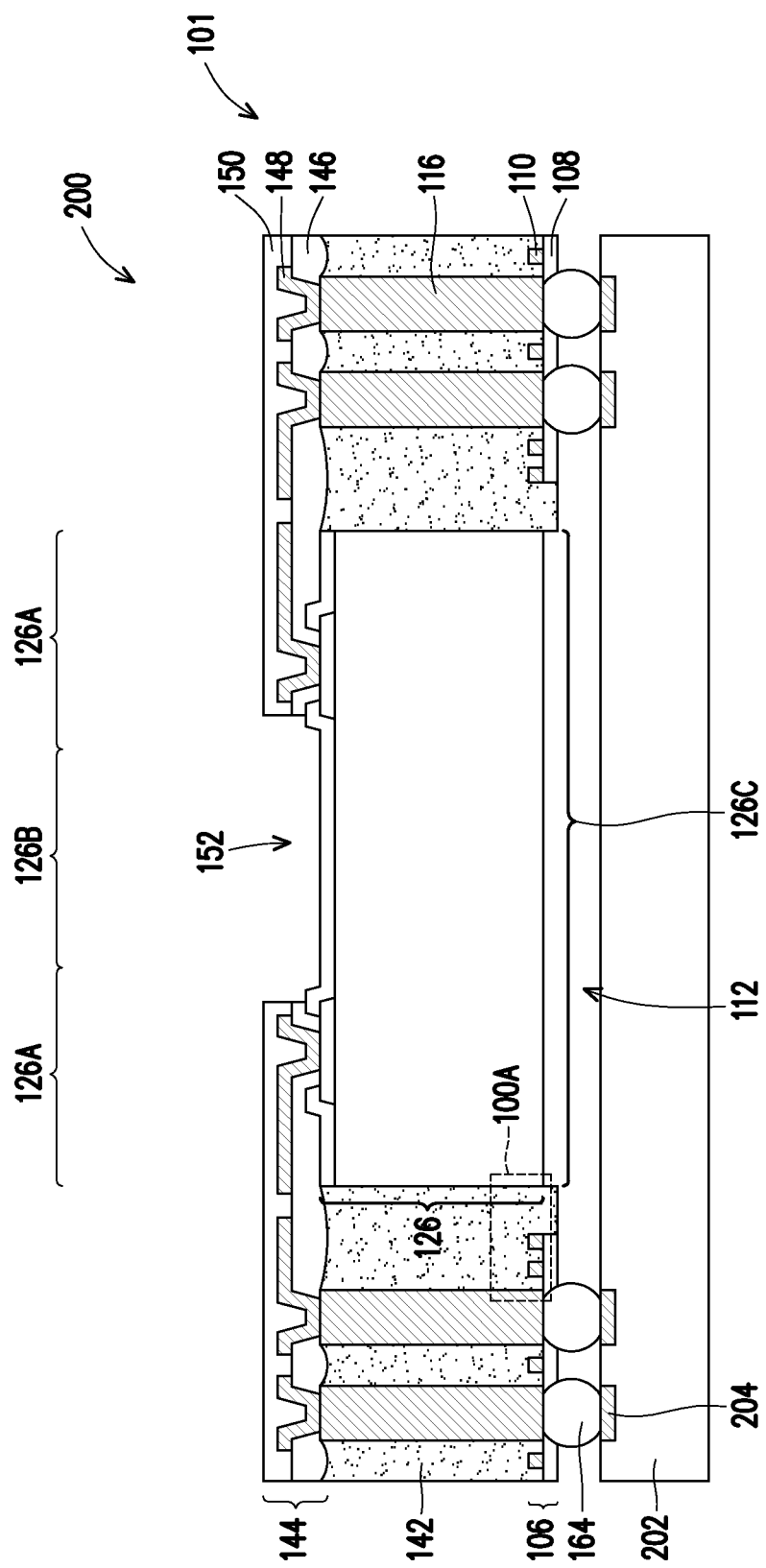

In FIG. 11, conductive connectors 164 are formed in the openings 162, physically and electrically connected the metallization pattern no and/or conductive vias 116. The conductive connectors 164 may include a conductive material such as solder, copper, aluminum, gold, nickel, silver, palladium, tin, the like, or a combination thereof. In some embodiments, the conductive connectors 164 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In some embodiments, the conductive connectors 164 include flux and are formed in a flux dipping process. In some embodiments, the conductive connectors 164 include a conductive paste such as solder paste, silver paste, or the like, and are dispensed in a printing process.

The sensor package 101 (see FIG. 12) is formed by performing a singulation process along scribe line regions of the package component 100. The singulation may be by sawing, laser drilling, or the like along the scribe lines between adjacent package regions. The singulation process separates the adjacent package regions of the package component 100. The resulting singulated sensor packages are from one of the package regions of the package component 100.

In FIG. 12, the sensor package 101 is mounted to a package substrate 202 using the conductive connectors 164. The package substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. Generally, a SOI substrate includes a layer of a semiconductor material such as epitaxial silicon, germanium, silicon germanium, SOI, SGOI, or combinations thereof. The package substrate 202 is, in one alternative embodiment, based on an insulating core such as a fiberglass reinforced resin core. One example core material is fiberglass resin such as $FR_4$. Alternatives for the core material include bismaleimide-triazine BT resin, or alternatively, other PCB materials or films. Build up films such as ABF or other laminates may be used for package substrate 202.

The package substrate 202 may include active and passive devices (not shown). As one of ordinary skill in the art will recognize, a wide variety of devices such as transistors, capacitors, resistors, combinations of these, and the like may be used to generate the structural and functional requirements of the design for the sensing device 200. The devices may be formed using any suitable methods.

The package substrate 202 may also include metallization layers and vias (not shown) and bond pads 204 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 202 is substantially free of active and passive devices.

In some embodiments, the conductive connectors 164 are reflowed to attach the sensor package 101 to the bond pads 204. The conductive connectors 164 electrically and/or physically connect the package substrate 202, including metallization layers in the package substrate 202, to the sensor package 101. In some embodiments, passive devices (e.g., surface mount devices (SMDs), not illustrated) may be attached to the sensor package 101 (e.g., bonded to the bond pads 204) prior to mounting on the package substrate 202. In such embodiments, the passive devices may be bonded to a same surface of the sensor package 101 as the conductive connectors 164.

The conductive connectors 164 may have an epoxy flux (not shown) formed thereon before they are reflowed, with at least some of the epoxy portion of the epoxy flux remaining after the sensor package 101 is attached to the package substrate 202. This remaining epoxy portion may act as an underfill to reduce stress and protect the joints resulting from the reflowing the conductive connectors 164. In some embodiments, an underfill (not shown) may be formed between the sensor package 101 and the package substrate 202, surrounding the conductive connectors 164. The underfill may be formed by a capillary flow process after the sensor package 101 is attached, or may be formed by a suitable deposition method before the sensor package 101 is attached.

In some embodiments, some residue of the adhesive 128 may remain after the opening 112 is re-formed. FIGS. 13A through 13D are detailed views of a region 100A in FIG. 12, in accordance with various embodiments. The embodiments of FIGS. 13A through 13D correspond, respectively, to the embodiments of FIGS. 5A through 5D, and show embodiments where portions of the extruded adhesive 128 remain around sidewalls of a portion of the integrated circuit die 126 after the removal process. As a result, the opening 112 exposes the adhesive 128, but may not expose sidewalls of the integrated circuit die 126.

In FIG. 13A, remaining portions of the adhesive 128 have a curved portion extending from the sidewall of the integrated circuit die 126 to the dielectric layer 108. The nearest edge of the dielectric layer 108 is physically separated from the sidewall of the integrated circuit die 126 by only the adhesive 128. In FIG. 13B, remaining portions of the adhesive 128 have a curved portion extending from the sidewall of the integrated circuit die 126 to beneath the integrated circuit die 126. The nearest edge of the dielectric layer 108 is physically separated from the sidewall of the integrated circuit die 126 by both the adhesive 128 and encapsulant 142. In FIG. 13C, remaining portions of the adhesive 128 have a curved portion extending from the sidewall of the integrated circuit die 126 to the dielectric layer 108, with no remaining adhesive 128 contacting sides of the dielectric layer 108. In FIG. 13D, remaining portions of the adhesive 128 has a curved portion extending from the sidewall of the integrated circuit die 126 to the dielectric layer 108, and also has a portion between the integrated circuit die 126 and dielectric layer 108, with no remaining adhesive 128 contacting sides of the dielectric layer 108.

In some embodiments, no residue of the adhesive 128 remains after the opening 112 is re-formed. FIGS. 14A through 14D are detailed view of a region 100A in FIG. 12, in accordance with various embodiments. The embodiments of FIGS. 14A through 14D correspond, respectively, to the embodiments of FIGS. 5A through 5D, and show embodiments where no portions of the extruded adhesive 128 around the integrated circuit die 126 remain after the removal process. As a result, the opening 112 extends partially into the encapsulant 142 and exposes sidewalls of a portion of the integrated circuit die 126.

In FIG. 14A, the opening 112 has a curved portion extending from the sidewall of the integrated circuit die 126 to the dielectric layer 108. In FIG. 14B, the opening 112 has a curved portion in the encapsulant 142. In FIG. 14C, the opening 112 has a curved portion extending from the sidewall of the integrated circuit die 126 to the dielectric layer 108, with an edge of the dielectric layer 108 being coplanar with an edge of the integrated circuit die 126. In FIG. 14D, the opening 112 has a curved portion extending from the sidewall of the integrated circuit die 126 to the dielectric layer 108, with an edge of the dielectric layer 108 being under an edge of the integrated circuit die 126.

Figure 15:
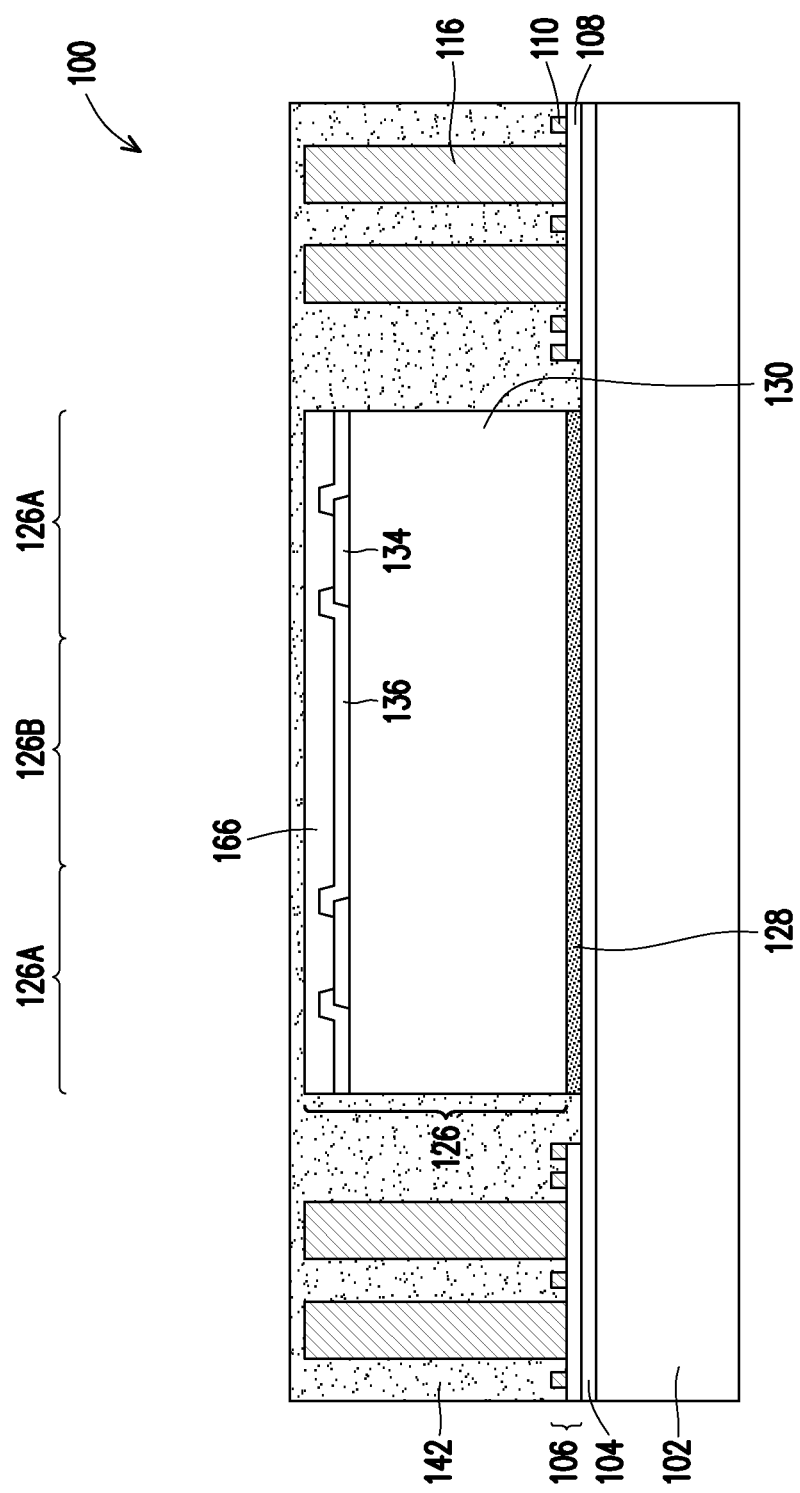
FIGS. 15 and 16 illustrate cross-sectional views of intermediate steps during a process for forming a sensor package, in accordance with some other embodiments.
Figure 16:
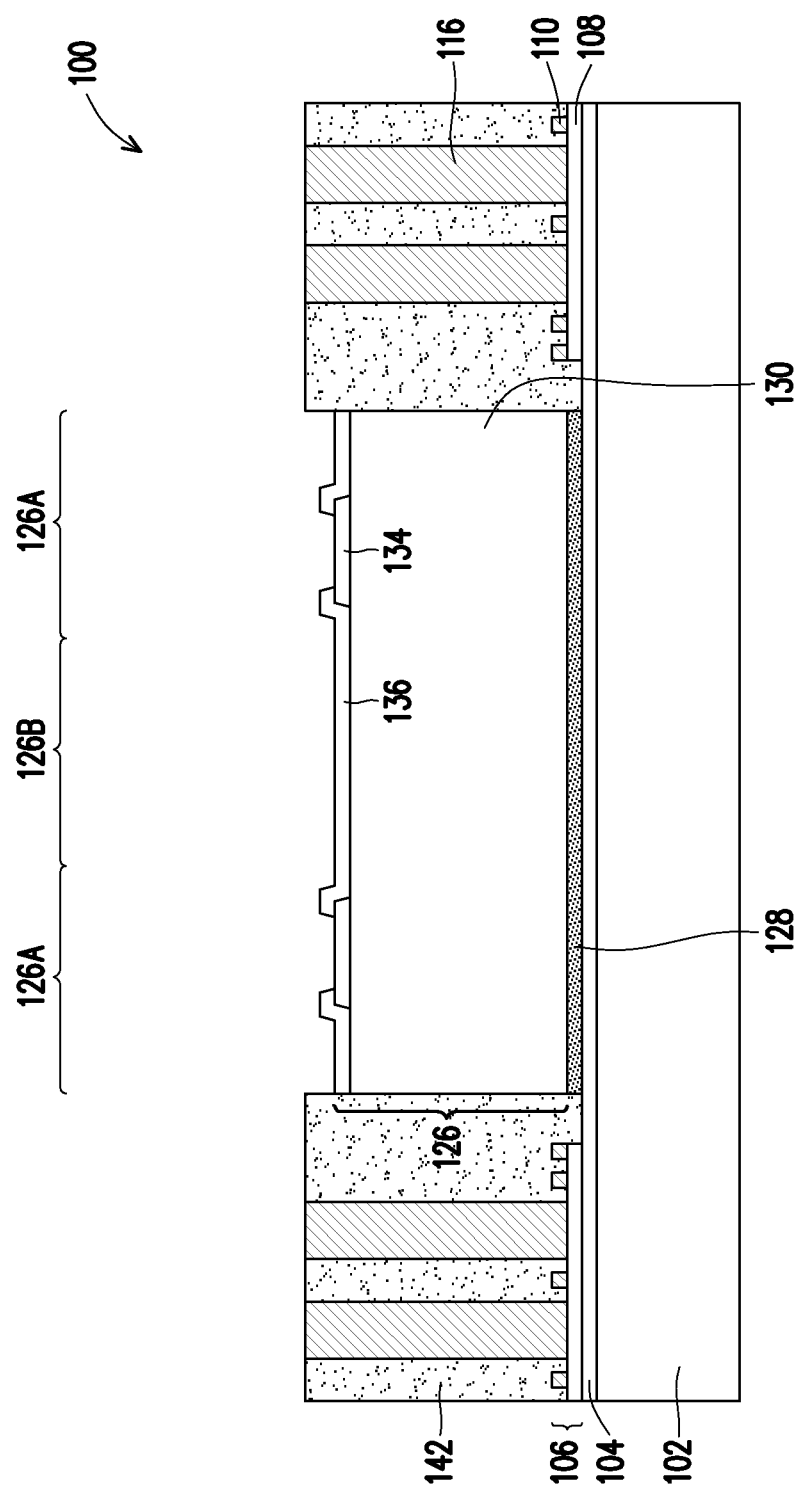

FIGS. 15 through 16 illustrate cross-sectional views of intermediate steps during a process for forming the package component 100, in accordance with some other embodiments. In this embodiment, the integrated circuit die 126 further includes a sacrificial film 166 over the passivation films 136 and pads 134. The sacrificial film 166 is formed of a photo-sensitive polymer, such as polybenzoxazole (PBO), polyimide, benzocyclobutene (BCB), or the like.

In FIG. 15, the encapsulant 142 is formed. The encapsulant 142 is formed by compression molding, such that the conductive vias 116 and integrated circuit die 126 are buried after the molding.

In FIG. 16, a planarization process is performed on the encapsulant 142 to expose the conductive vias 116 and sacrificial film 166. The planarization process may also grind the sacrificial film 166. Top surfaces of the conductive vias 116, encapsulant 142, and sacrificial film 166 are coplanar after the planarization process. The planarization process may be, for example, a chemical-mechanical polish (CMP), a grinding process, or the like. The sacrificial film 166 is then removed, exposing the sensing region 126B of the integrated circuit die 126. When the sacrificial film 166 is a photo-sensitive polymer, it may be removed by exposure and development.

Figure 17:
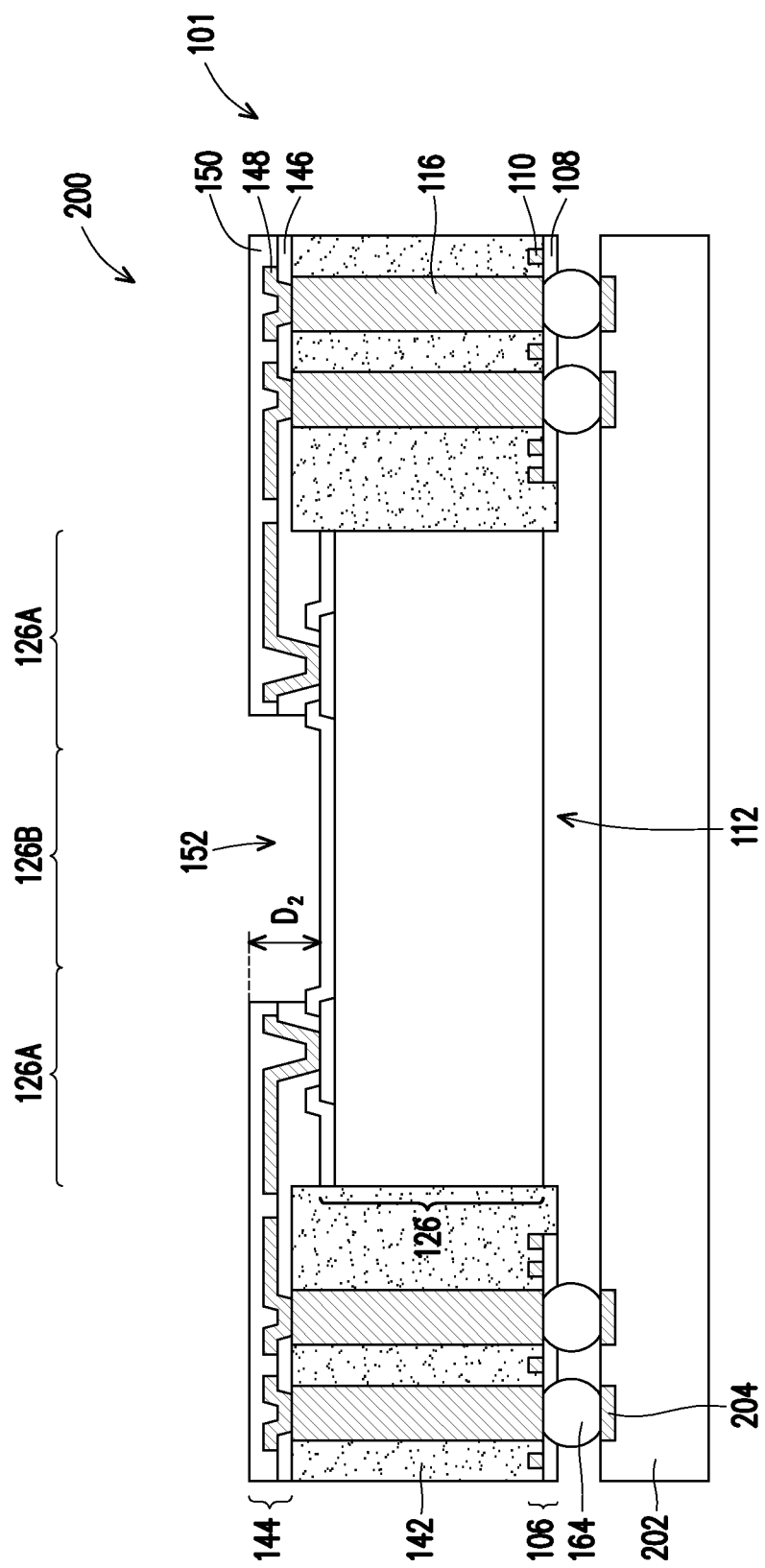
FIG. 17 illustrates a sensing device implementing a sensor package, in accordance with some other embodiments.

FIG. 17 illustrates the sensing device 200. Due to removal of the sacrificial film 166, a topmost surface of the passivation films 136 is below a topmost surface of the encapsulant 142. The opening 152 has a second depth $D_2$ extending from a major surface of the passivation films 136 to a topmost surface of the dielectric layer 150. The second depth $D_2$ is greater than the first depth $D_1$. In some embodiments, the second depth $D_2$ is in the range of from about 22.5 μm to about 32.5 μm.

Figure 18:
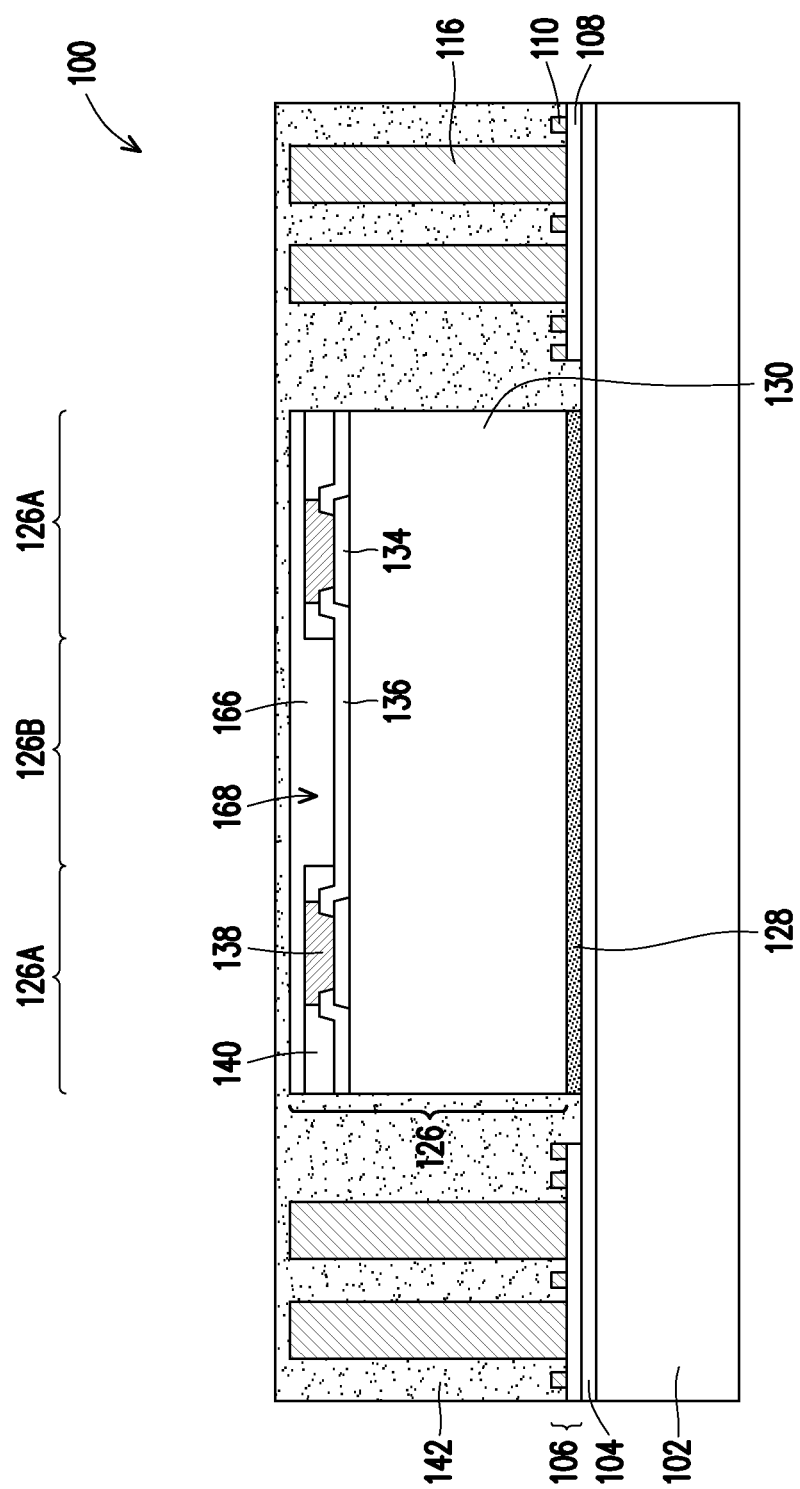
FIGS. 18 and 19 illustrate cross-sectional views of intermediate steps during a process for forming a sensor package, in accordance with some other embodiments.
Figure 19:
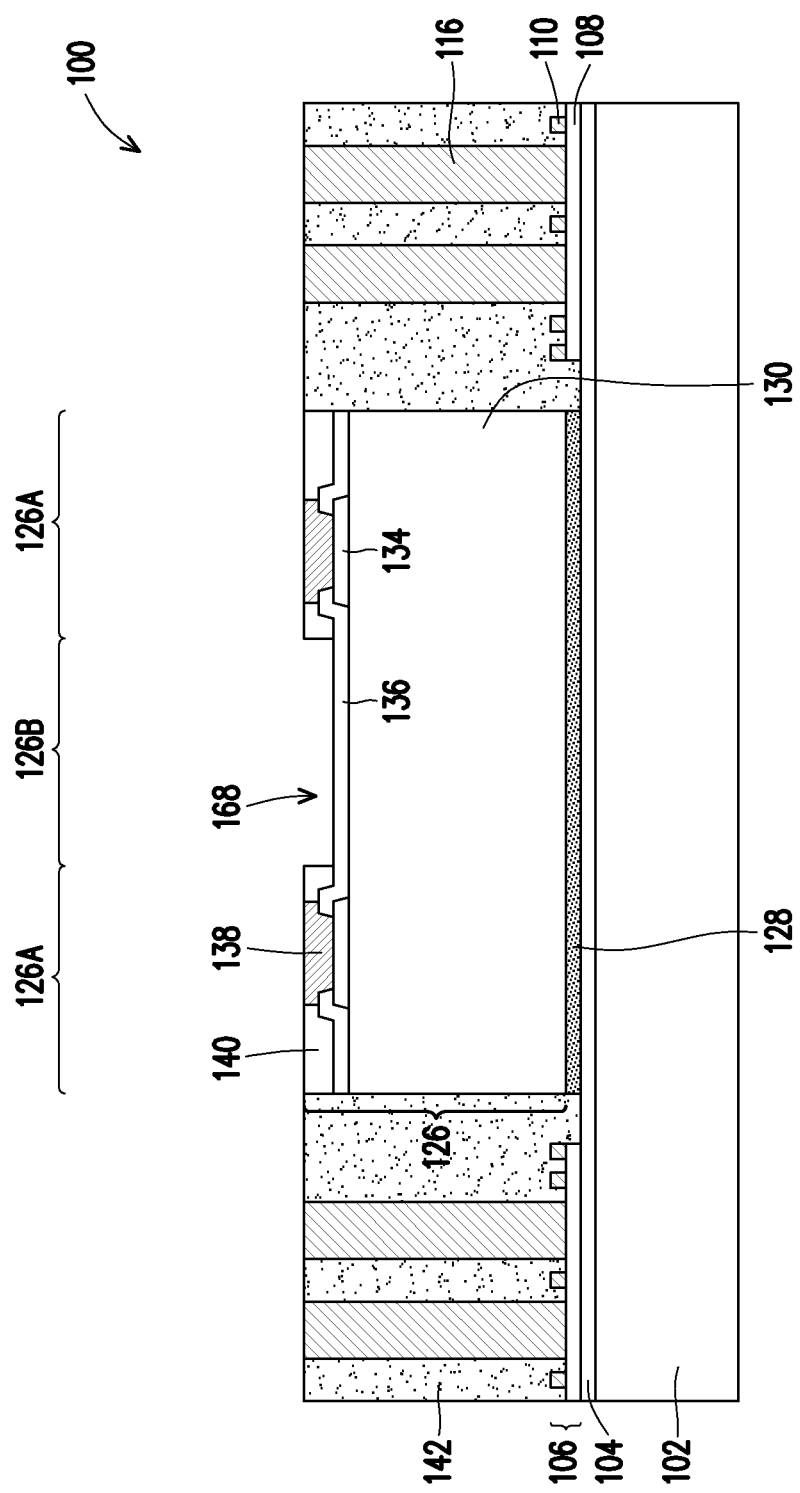

FIGS. 18 through 19 illustrate cross-sectional views of intermediate steps during a process for forming the package component 100, in accordance with some other embodiments. In this embodiment, the integrated circuit die 126 further includes die connectors 138, such as conductive pillars (for example, formed of a metal such as copper), which extend through the openings in the passivation films 136 to be physically and electrically connected to respective one of the pads 134. The die connectors 138 may be formed by, for example, plating, or the like. The die connectors 138 are thus electrically connected to the integrated circuits of the integrated circuit die 126. A dielectric material 140 is over the active surface of the integrated circuit die 126, such as on the passivation films 136 and the die connectors 138. The dielectric material 140 laterally encapsulates the die connectors 138, and the dielectric material 140 is laterally coterminous with the integrated circuit die 126. The dielectric material 140 may be a nitride such as silicon nitride or the like, and may be formed, for example, by CVD or the like. The dielectric material 140 includes an opening 168 exposing the sensing region 126B of the integrated circuit die 126, which may be formed by acceptable photolithography and etching techniques. The sacrificial film 166 is initially formed over the dielectric material 140 and in the opening 168.

In FIG. 18, the encapsulant 142 is formed. The encapsulant 142 is formed by compression molding, such that the conductive vias 116 and integrated circuit die 126 are buried after the molding.

In FIG. 19, a planarization process is performed on the encapsulant 142 to expose the conductive vias 116 and the die connectors 138. The planarization process may also grind the sacrificial film 166. Topmost surfaces of the conductive vias 116, die connectors 138, encapsulant, and dielectric material 140 are coplanar after the planarization process. The planarization process may be, for example, a CMP, a grinding process, or the like. The sacrificial film 166 is then removed, exposing the sensing region 126B of the integrated circuit die 126. When the sacrificial film 166 is a photo-sensitive polymer, it may be removed by exposure and development.

Figure 20:
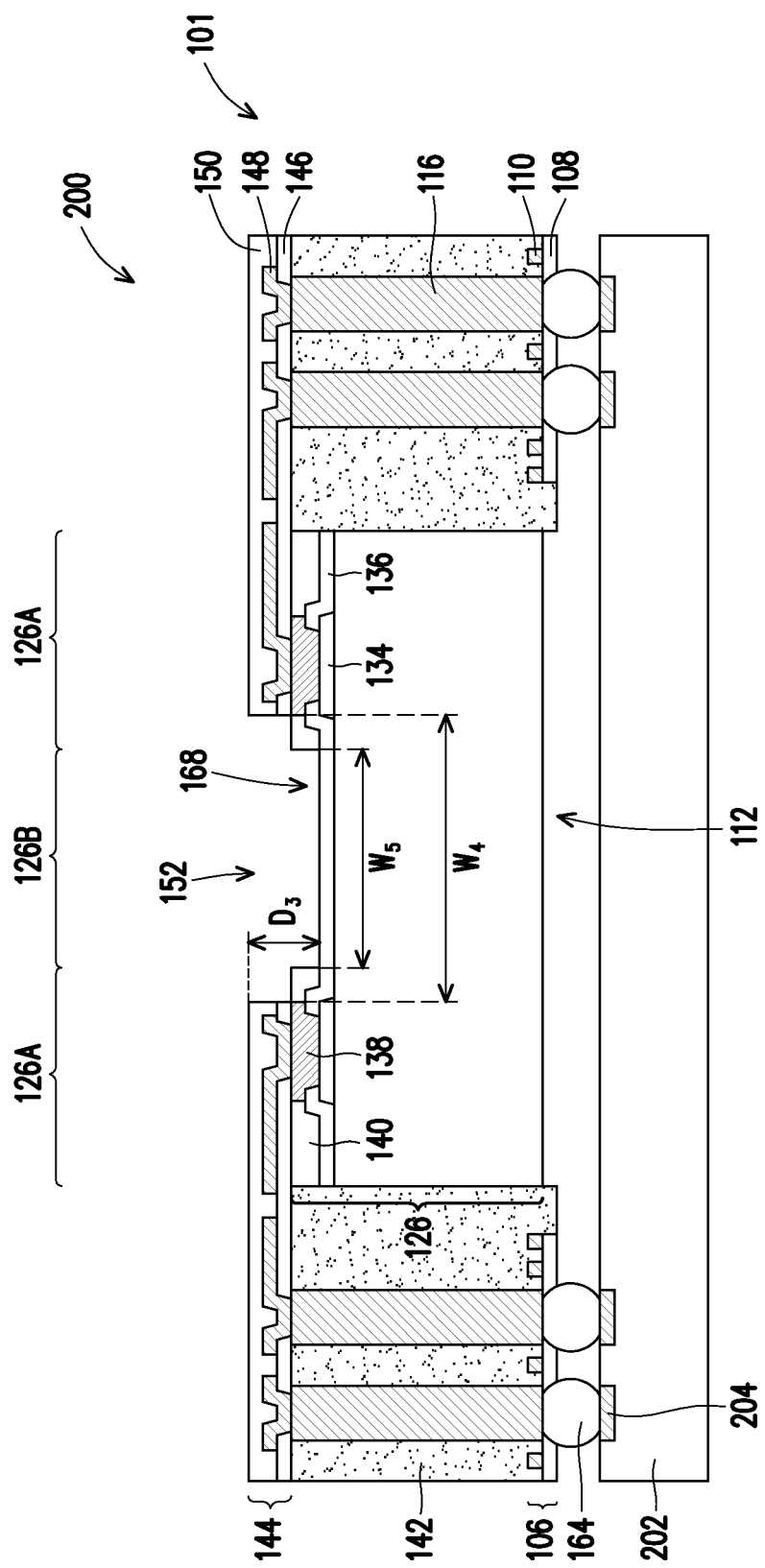
FIG. 20 illustrates a sensing device implementing a sensor package, in accordance with some other embodiments.

FIG. 20 illustrates the sensing device 200. The opening 168 has a fifth width $W_5$, which may be less than the fourth width $W_4$ of the opening 152. In some embodiments, the fifth width $W_5$ is in the range of from about 15806 μm to about 29534 μm. The openings 152 and 168 have a combined third depth $D_3$ extending from a major surface of the passivation films 136 to a topmost surface of the dielectric layer 150. The third depth $D_3$ is greater than the second depth $D_2$. In some embodiments, the third depth $D_3$ is in the range of from about 22.5 μm to about 32.5 μm.

Figure 21:
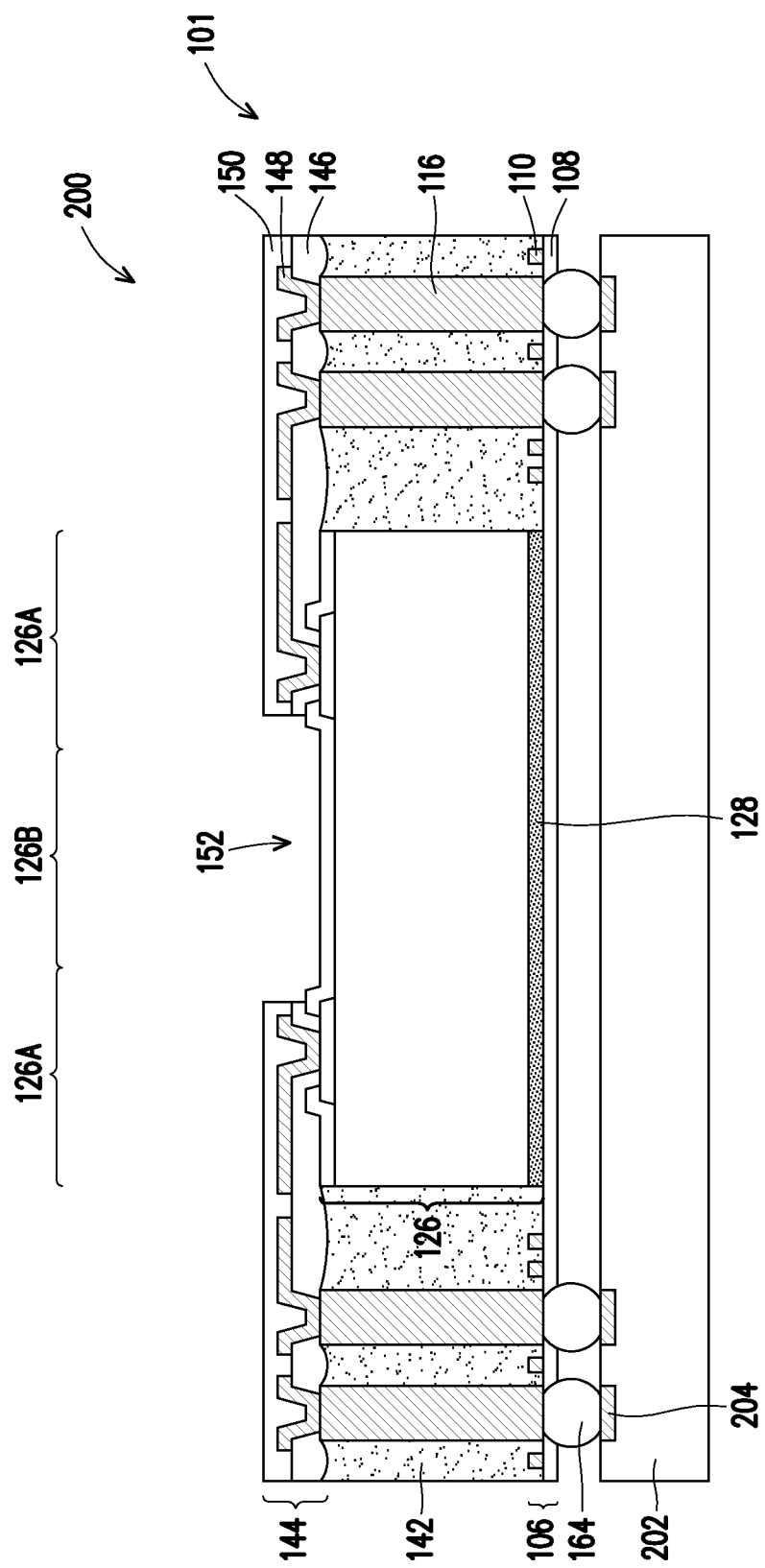
FIGS. 21, 22, and 23 illustrate a sensing device implementing a sensor package, in accordance with some other embodiments.
Figure 22:
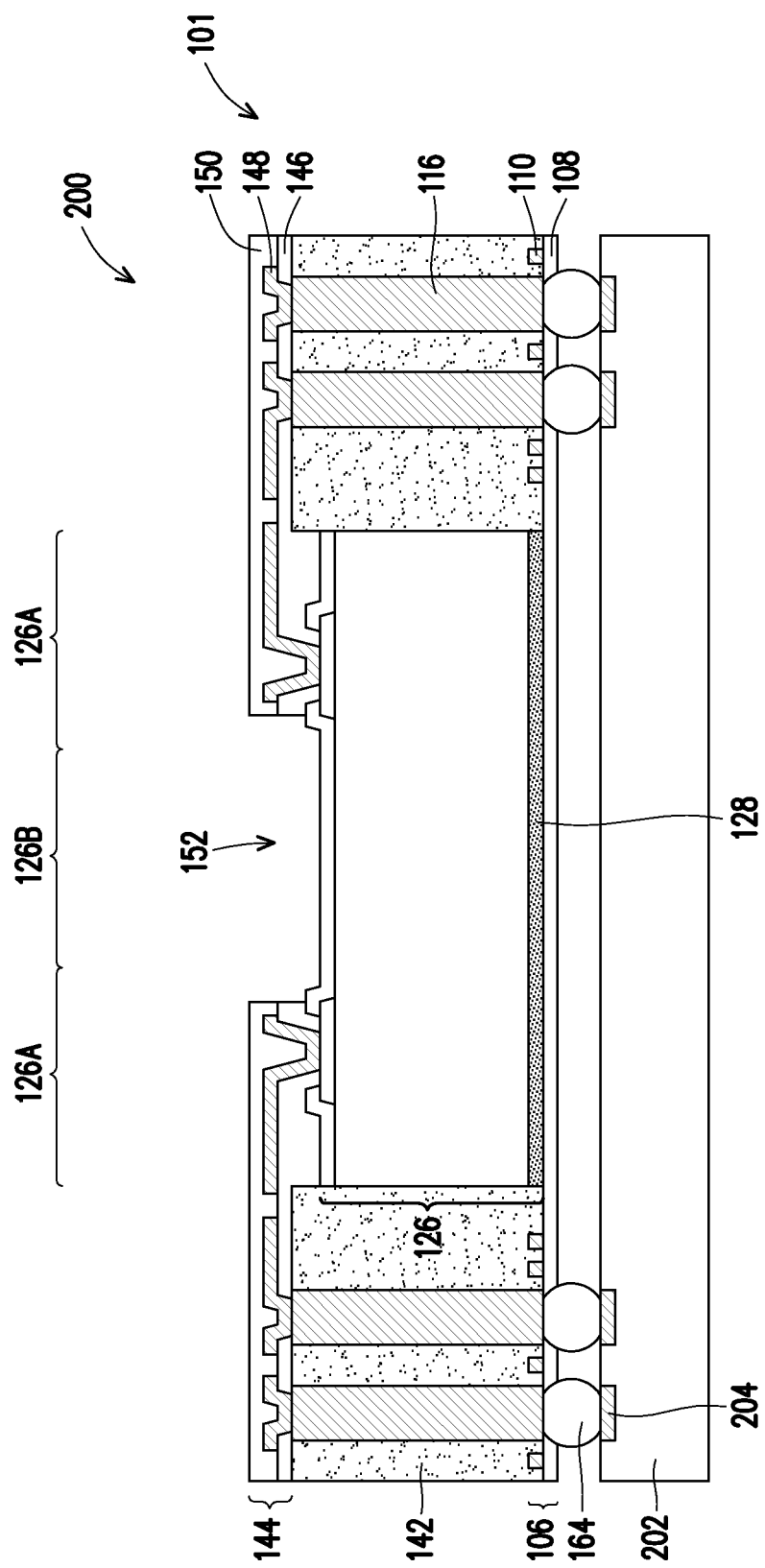
Figure 23:
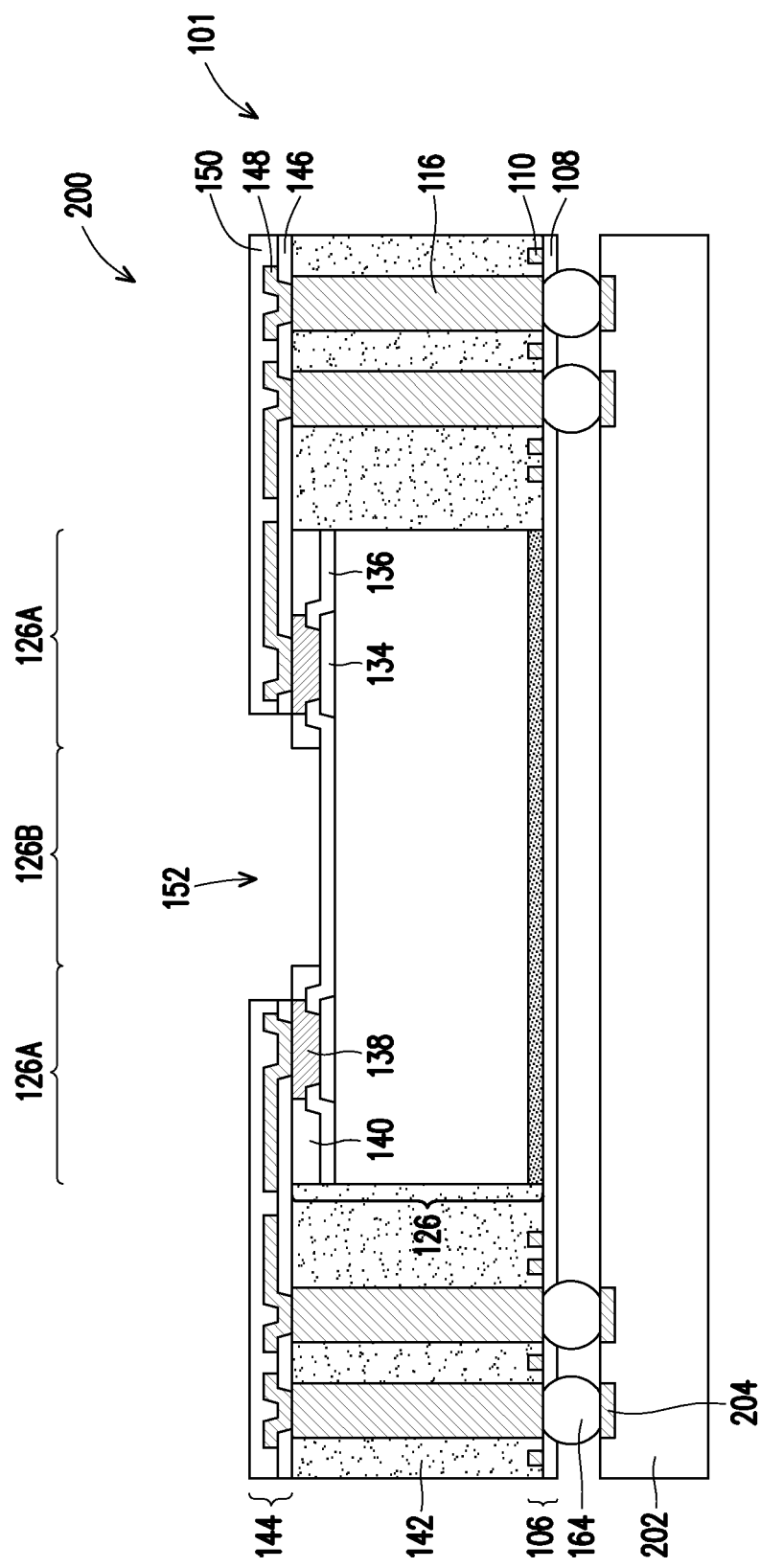

FIGS. 21, 22, and 23 illustrate the sensing device 200, in accordance with some other embodiments. FIGS. 21, 22, and 23 are, respectively, variations of the embodiments shown in FIGS. 12, 17, and 20. In these embodiments, the opening 112 is not formed through the back-side redistribution structure 106. The opening 112 may not be formed in embodiments where the integrated circuit die 126 has no sensing region 126C at its back surface. Such embodiments may have a lower cost of manufacturing.

FIGS. 24A through 24C illustrate the package component 100, in accordance with other embodiments. FIGS. 24A through 24C show variations of the embodiment of FIG. 21 (e.g., where the encapsulant 142 is formed by transfer molding and the opening 112 is not formed through the back-side redistribution structure 106), however, it should be appreciated that the variations shown in FIGS. 24A through 24C may be combined with any of the other embodiments described herein. FIG. 24A shows a variation of the package component 100 where the metallization pattern no is omitted, and only the dielectric layer 108 is formed. FIGS. 24B and 24C show variations where the conductive vias 116 are plated from features of the metallization pattern 110. For example, the metallization pattern no may include pads 114, from which the conductive vias 116 are plated (e.g., using a same seed layer as the pads 114). In FIG. 24B, the width of the pads 114 is greater than the width of the conductive vias 116. For example, in such embodiments, the pads 114 may have a width in the range of from about 160 μm to about 320 μm, and the conductive vias 116 may have a width in the range of from about 150 μm to about 280 μm. In FIG. 24C, the width of the pads 114 is less than the width of the conductive vias 116. For example, in such embodiments, the pads 114 may have a width in the range of from about 140 μm to about 270 μm, and the conductive vias 116 may have a width in the range of from about 150 μm to about 280 μm.

Embodiments may achieve advantages. Packaging a sensor die (e.g., the integrated circuit die 126) in an InFO package (e.g., the sensor package 101) may allow the form factor of the final sensor package to be decreased. For example, some InFO sensor packages may be up to 500 μm smaller than wire bond sensor packages. Further, wire loops over the I/O region 126A may be avoided, reducing the distance between the sensing region 126B and a target, thereby increasing sensitivity of the sensor die. The mechanical reliability of the sensor package may also be improved over other (e.g., wire bond) packaging schemes. The manufacturing yield of InFO packages may also be greater than that of wire bond packages. Because an InFO package exposes less surface area of a sensor die than other packaging schemes, sensing regions of the sensor die may be easier to keep clean, improving sensing accuracy. Finally, supporting layers or heatsinks may be easier to integrated on an InFO package than on a wire bond package.

In an embodiment, a device includes: a sensor die having a first surface and a second surface opposite the first surface, the sensor die having an input/output region and a first sensing region at the first surface; an encapsulant at least laterally encapsulating the sensor die; a conductive via extending through the encapsulant; and a front-side redistribution structure on the first surface of the sensor die, the front-side redistribution structure being connected to the conductive via and the sensor die, the front-side redistribution structure covering the input/output region of the sensor die, the front-side redistribution structure having a first opening exposing the first sensing region of the sensor die. In some embodiments, the device further includes: a back-side redistribution structure on the second surface of the sensor die, the back-side redistribution structure being connected to the conductive via. In some embodiments of the device, the back-side redistribution structure includes: a dielectric layer; and a metallization pattern disposed between the dielectric layer and the encapsulant, the metallization pattern being electrically connected to the conductive via. In some embodiments of the device, the sensor die has a second sensing region at the second surface, and the back-side redistribution structure has a second opening exposing the second sensing region of the sensor die. In some embodiments of the device, the second opening extends partially into the encapsulant and exposes sidewalls of a portion of the sensor die. In some embodiments, the device further includes: an adhesive surrounding a portion of the sensor die, the second opening exposing the adhesive. In some embodiments of the device, the sensor die includes: a semiconductor substrate; pads on the semiconductor substrate, the pads being connected to the front-side redistribution structure; and a passivation film on the pads and the semiconductor substrate, a topmost surface of the passivation film being above a topmost surface of the encapsulant. In some embodiments of the device, the sensor die includes: a semiconductor substrate; pads on the semiconductor substrate, the pads being connected to the front-side redistribution structure; and a passivation film on the pads and the semiconductor substrate, a topmost surface of the passivation film being below a topmost surface of the encapsulant. In some embodiments of the device, the sensor die includes: a semiconductor substrate; pads on the semiconductor substrate, the pads being connected to the front-side redistribution structure; a passivation film on the pads and the semiconductor substrate; and a dielectric layer over the passivation film, the dielectric layer having a second opening exposing the first sensing region of the sensor die, a width of the second opening being less than a width of the first opening. In some embodiments of the device, the first sensing region of the sensor die and the first opening of the front-side redistribution structure have the same width.

In an embodiment, a method includes: placing a sensor die adjacent to a conductive via, the sensor die having an input/output region and a first sensing region; encapsulating the sensor die and the conductive via with an encapsulant; forming a first dielectric layer on the encapsulant, the sensor die, and the conductive via; patterning the first dielectric layer with a first opening exposing the conductive via, a second opening exposing the input/output region of the sensor die, and a third opening exposing the first sensing region of the sensor die; forming a first metallization pattern extending through the first opening and the second opening of the first dielectric layer, the third opening of the first dielectric layer being free from the first metallization pattern; forming a second dielectric layer on the first metallization pattern and the first dielectric layer; and extending the third opening through the second dielectric layer to expose the first sensing region of the sensor die.

In some embodiments of the method, the sensor die includes a semiconductor substrate and pads on the semiconductor substrate, where encapsulating the sensor die includes: forming the encapsulant by transfer molding such that a recess in the encapsulant is disposed between the semiconductor substrate and the conductive via. In some embodiments of the method, the sensor die includes a semiconductor substrate and pads on the semiconductor substrate, where encapsulating the sensor die includes: forming the encapsulant by compression molding; and planarizing the encapsulant such that top surfaces of the encapsulant and the conductive via extend above a top surface of the semiconductor substrate. In some embodiments of the method, the sensor die further includes a sacrificial film over the semiconductor substrate, and further including: removing the sacrificial film to form a fourth opening exposing the first sensing region of the sensor die. In some embodiments, the method further includes: plating the conductive via on a third dielectric layer; and forming a second metallization pattern on the third dielectric layer. In some embodiments of the method, placing the sensor die includes: adhering the sensor die to the third dielectric layer with an adhesive. In some embodiments, the method further includes: forming a fourth opening in the third dielectric layer. In some embodiments of the method, placing the sensor die includes adhering the sensor die in the fourth opening with an adhesive, and further including: after encapsulating the sensor die, removing at least a portion of the adhesive to expose a second sensing region at a back surface of the sensor die.

In an embodiment, a method includes: forming a back-side redistribution structure, the back-side redistribution structure having a first opening; adhering a sensor die in the first opening of the back-side redistribution structure with an adhesive, the sensor die having a first surface and a second surface opposite the first surface; encapsulating the sensor die with an encapsulant; forming a front-side redistribution structure over the encapsulant and the sensor die, the front-side redistribution structure having a second opening exposing the second surface of the sensor die; and after forming the front-side redistribution structure, removing the adhesive to expose the first surface of the sensor die.

In some embodiments, the method further includes: attaching the back-side redistribution structure to a package substrate with conductive connectors, the conductive connectors extending through a dielectric layer of the back-side redistribution structure to contact a metallization pattern of the back-side redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a sensor die having a top surface and a bottom surface opposite the top surface, the sensor die having an input/output region and a first sensing region at the top surface;
   an encapsulant at least laterally encapsulating the sensor die, the encapsulant having a top surface, a bottom surface, and a curved surface, the curved surface extending from the bottom surface of the encapsulant to a sidewall of the sensor die;
   a conductive via extending through the encapsulant; and
   a front-side redistribution structure on the top surface of the sensor die and the top surface of the encapsulant, the front-side redistribution structure being connected to the conductive via and the sensor die, the front-side redistribution structure covering the input/output region of the sensor die, the front-side redistribution structure having a first opening exposing the first sensing region of the sensor die.

2. The device of claim 1 further comprising:
   a back-side redistribution structure on the bottom surface of the encapsulant, the back-side redistribution structure being connected to the conductive via.

3. The device of claim 2, wherein the back-side redistribution structure comprises:
   a dielectric layer; and
   a metallization pattern disposed between the dielectric layer and the encapsulant, the metallization pattern being electrically connected to the conductive via.

4. The device of claim 2, wherein the sensor die has a second sensing region at the bottom surface of the sensor die, and the back-side redistribution structure has a second opening exposing the second sensing region of the sensor die.

5. The device of claim 4, wherein the second opening extends partially into the encapsulant and exposes the sidewall of the sensor die.

6. The device of claim 4 further comprising:
   an adhesive surrounding a portion of the sensor die, the second opening exposing the adhesive.

7. The device of claim 1, wherein the sensor die comprises:
   a semiconductor substrate;
   pads on the semiconductor substrate, the pads being connected to the front-side redistribution structure; and
   a passivation film on the pads and the semiconductor substrate, a top surface of the passivation film being above the top surface of the encapsulant.

8. The device of claim 1, wherein the sensor die comprises:
   a semiconductor substrate;
   pads on the semiconductor substrate, the pads being connected to the front-side redistribution structure; and
   a passivation film on the pads and the semiconductor substrate, a top surface of the passivation film being below the top surface of the encapsulant.

9. The device of claim 1, wherein the sensor die comprises:
   a semiconductor substrate;
   pads on the semiconductor substrate, the pads being connected to the front-side redistribution structure;
   a passivation film on the pads and the semiconductor substrate; and
   a dielectric layer over the passivation film, the dielectric layer having a second opening exposing the first sensing region of the sensor die, a width of the second opening being less than a width of the first opening.

10. The device of claim 1, wherein the first sensing region of the sensor die and the first opening of the front-side redistribution structure have the same width.

11. A device comprising:
    a first redistribution structure comprising first redistribution lines and a first dielectric layer, the first redistribution lines disposed on the first dielectric layer, the first dielectric layer having a first opening;
    a second redistribution structure comprising second redistribution lines and a second dielectric layer, the second redistribution lines disposed on the second dielectric layer, the second dielectric layer having a second opening;
    a molding compound between the first redistribution structure and the second redistribution structure;
    conductive vias extending through the molding compound, the conductive vias connecting the first redistribution lines to the second redistribution lines; and a sensor die in the molding compound, a front-side of the sensor die having an input/output region and a first sensing region, the input/output region connected to the conductive vias by the first redistribution lines, the first sensing region exposed by the first opening in the first dielectric layer, a back-side of the sensor die having a second sensing region, the second sensing region exposed by the second opening in the second dielectric layer.

12. The device of claim 11, wherein the second opening extends into the molding compound, the second opening having a curved portion extending from a sidewall of the sensor die to the second dielectric layer, an edge of the second dielectric layer being offset from an edge of the sensor die.

13. The device of claim 11, wherein the second opening extends into the molding compound, the second opening having a curved portion extending from a sidewall of the sensor die to the second dielectric layer, an edge of the second dielectric layer being coplanar with an edge of the sensor die.

14. The device of claim 11, wherein the second opening extends into the molding compound, the second opening having a curved portion extending from a sidewall of the sensor die to the second dielectric layer, an edge of the second dielectric layer being under an edge of the sensor die.

15. The device of claim 11, wherein the second opening extends into the molding compound, the second opening having a curved portion in the molding compound.

16. A device comprising:
a first redistribution structure comprising first redistribution lines and a first dielectric layer, the first dielectric layer having a first opening;
a second redistribution structure comprising second redistribution lines and a second dielectric layer, the second dielectric layer having a second opening;
a molding compound between the first redistribution structure and the second redistribution structure;
conductive vias extending through the molding compound, the conductive vias connecting the first redistribution lines to the second redistribution lines; and
a sensor die in the molding compound, a front-side of the sensor die having an input/output region and a first sensing region, a back-side of the sensor die having a second sensing region, the input/output region connected to the conductive vias by the first redistribution lines, the first sensing region exposed by the first opening in the first dielectric layer, the second sensing region exposed by the second opening in the second dielectric layer, the molding compound contacting sidewalls of the conductive vias and a sidewall of the sensor die.

17. The device of claim 16, further comprising:
an adhesive disposed between the molding compound and the sidewall of the sensor die.

18. The device of claim 16, wherein the second opening extends into the molding compound, the second opening exposing the sidewall of the sensor die.

19. The device of claim 16, wherein the molding compound has a bottom surface and a curved surface, the curved surface of the molding compound connecting the bottom surface of the molding compound to the sidewall of the sensor die.

20. The device of claim 16, wherein the first sensing region of the sensor die and the first opening of the first dielectric layer have the same width.

* * * * *